(12) United States Patent
Mori et al.

(10) Patent No.: US 8,896,129 B2
(45) Date of Patent: Nov. 25, 2014

(54) SEMICONDUCTOR DEVICE AND MANUFACTURING METHOD FOR THE SAME

(71) Applicant: Renesas Electronics Corporation, Kawasaki-shi, Kanagawa (JP)

(72) Inventors: Ryo Mori, Kanagawa (JP); Kazuki Fukuoka, Kanagawa (JP); Naozumi Morino, Kanagawa (JP); Yoshinori Deguchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/767,940

(22) Filed: Feb. 15, 2013

(65) Prior Publication Data
US 2013/0256906 A1 Oct. 3, 2013

(30) Foreign Application Priority Data
Mar. 27, 2012 (JP) .................. 2012-070840

(51) Int. Cl.
| H01L 23/48 | (2006.01) |
| H01L 23/00 | (2006.01) |
| H01L 21/02 | (2006.01) |
| H01L 23/538 | (2006.01) |

(52) U.S. Cl.
CPC ............ *H01L 23/5384* (2013.01); *H01L 24/06* (2013.01); *H01L 24/05* (2013.01); *H01L 21/02697* (2013.01)

USPC ........... 257/774; 257/508; 257/510; 257/530; 257/700; 257/758; 438/622; 438/629; 438/710; 438/743

(58) Field of Classification Search
CPC ..................... H01L 21/02697; H01L 23/5384; H01L 24/05; H01L 24/06
See application file for complete search history.

(56) References Cited

U.S. PATENT DOCUMENTS

| 2006/0097396 A1* | 5/2006 | Kamiyama et al. ........... 257/758 |
| 2006/0279001 A1 | 12/2006 | Nishida |
| 2009/0184424 A1 | 7/2009 | Furusawa et al. |

FOREIGN PATENT DOCUMENTS

| JP | 2002-076075 A | 3/2002 |
| JP | 2006-351588 A | 12/2006 |
| JP | 2009-170763 A | 7/2009 |

\* cited by examiner

*Primary Examiner* — Kyoung Lee
(74) *Attorney, Agent, or Firm* — Miles & Stockbridge P.C.

(57) ABSTRACT

A semiconductor device includes a substrate including a circuit region where a circuit element is formed, a multilayer wiring layer that is formed on the substrate and composed of a plurality of wiring layers and a plurality of via layers that are laminated, and an electrode pad that is formed on the multilayer wiring layer. An interlayer insulating film is formed in a region of a first wiring layer that is a top layer of the plurality of wiring layers, in the region the electrode pad and the first circuit region overlapping each other in a planar view of the electrode pad.

15 Claims, 20 Drawing Sheets

SEMICONDUCTOR DEVICE AND MANUFACTURING METHOD FOR THE SAME

CROSS-REFERENCE TO RELATED APPLICATIONS

This application is based upon and claims the benefit of priority from Japanese patent application No. 2012-070840, filed on Mar. 27, 2012, the disclosure of which is incorporated herein in its entirety by reference.

BACKGROUND

The present invention relates to a semiconductor device and a manufacturing method for the same, and for example, to a semiconductor device including an electrode pad and a manufacturing method for the same.

A semiconductor device includes an electrode pad for connecting to an external electrode terminal. This electrode pad is also used to examine electrical properties of the semiconductor device. Specifically, a probe of an inspection device is brought into contact with the electrode pad, and the semiconductor device is energized via the probe, so as to examine the electrical properties of the semiconductor device. In this way, as the probe of the inspection apparatus is brought into contact with the electrode pad at the time of examining the electrical properties of the semiconductor device, large stress is imposed on the electrode pad, thereby possibly damaging the electrode pad and the semiconductor device.

Japanese Unexamined Patent Application Publication No. 2002-76075 discloses a technique concerning a semiconductor device that is capable of reducing the chip size by forming test electrode pads utilizing the top wiring layer on a vacant I/O area. Japanese Unexamined Patent Application Publication No. 2006-351588 discloses a technique concerning a semiconductor device that is capable of preventing damage to an electrode pad caused by bonding. Japanese Unexamined Patent Application Publication No. 2009-170763 discloses a technique concerning a semiconductor device that is capable of preventing generation of cracks in an insulating film below an electrode pad due to external force applied to the electrode pad of the semiconductor device.

SUMMARY

As explained in Background, large stress is imposed on the electrode pad at the time of examining the electrical properties of the semiconductor device by the probe of the inspection device being brought into contact with the electrode pad. The stress arising from the contact of the probe could damage circuit elements formed on the semiconductor device. For this reason, constraints are required in the layout of the circuit elements such that the circuit elements should not be disposed below the electrode pad.

However, recent development in microfabrication techniques contributes to reduction in the size of the circuit elements and thus reduction in the chip size. Meanwhile, the number of the electrode pads of the semiconductor device increases along with the increase in the number of functions of the semiconductor device. Consequently, the present inventor has found a problem that the ratio of the area occupied by the electrode pads on the chip area increases, and the constraints on the layout of the circuit elements in light of the positions of the electrode pads inhibit the reduction in the chip size.

Other problems and new features will be apparent from the description in the present specification and the drawings attached herewith.

An aspect of the present invention is a semiconductor device that includes a substrate provided with a first circuit region, a multilayer wiring layer composed of a plurality of wiring layers and a plurality of via layers that are laminated, and an electrode pad that is formed on the multilayer wiring layer. Further, an interlayer insulating film is formed in a region of a first wiring layer that is a top layer of the plurality of wiring layers, in the region the electrode pad and the first circuit region overlapping each other in a planar view of the electrode pad.

Another aspect of the present invention is a manufacturing method for a semiconductor device that includes forming a first circuit element in a first circuit region of a substrate, forming a multilayer wiring layer on the substrate, and forming an electrode pad on the multilayer wiring layer. Further, at the time of forming the multilayer wiring layer, an interlayer insulating film is formed in a region of a first wiring layer that is a top layer of the plurality of wiring layers, in the region the electrode pad and the first circuit region overlapping each other in a planar view of the electrode pad.

According to the aspects of the present invention, it is possible to provide a semiconductor device capable of realizing reduction in the chip size and a manufacturing method for the same.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
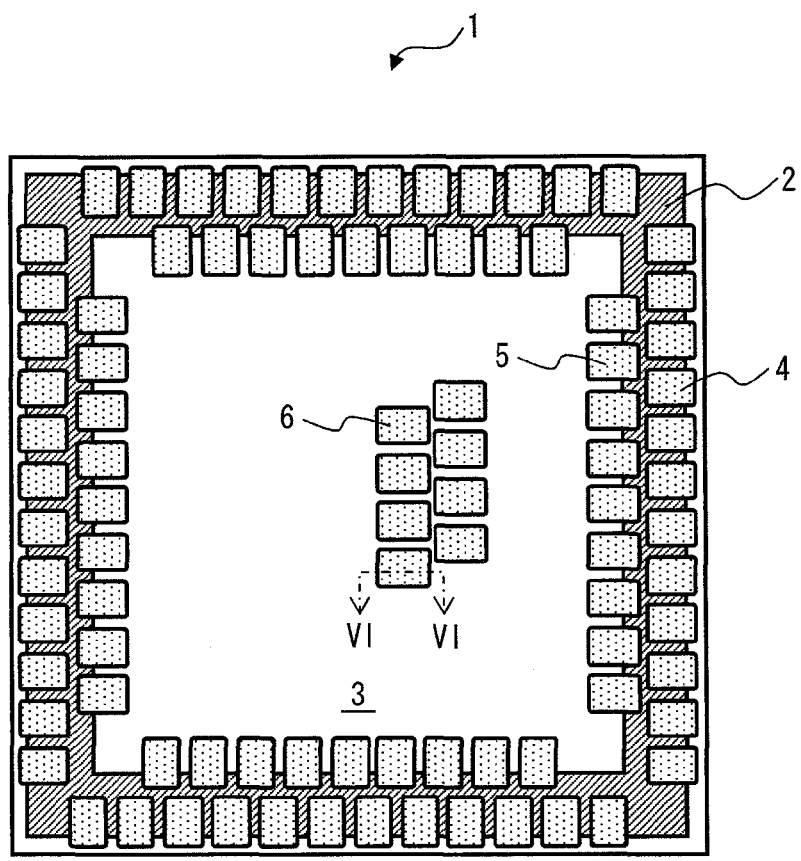
FIG. 1 is a top view showing an example of a semiconductor device according to a first embodiment.

FIG. 1 is a top view showing an example of a semiconductor device according to a first embodiment. As shown in FIG. 1, a semiconductor device 1 according to this embodiment includes an I/O circuit region 2 where I/O circuits are formed, an internal circuit region 3 where internal circuits are formed, and electrode pads 4, 5, and 6.

The I/O circuit region 2 is disposed along a circumference of the semiconductor device 1, and the internal circuit region 3 is disposed in the center of the semiconductor device 1. In other words, the I/O circuit region 2 is disposed in a frame shape to surround the internal circuit region 3. The internal circuits formed in the internal circuit region 3 are, for example, a memory circuit and a logic circuit. The I/O circuits formed in the I/O circuit region 2 are, for example, an input/output circuit, such as an input buffer circuit and an output buffer circuit, and a level shifter.

The I/O circuit can be composed of a MOS (Metal Oxide Semiconductor), for example, including a thick oxide film with a certain degree of withstand voltage against external voltage. Further, the internal circuit may be composed of a MOS, for example, with a relatively thin oxide film that is driven by lower driving voltage than driving voltage of the I/O circuit. However, the above examples are merely illustrative, and the I/O circuit and the internal circuit are not necessarily distinguished by the driving voltage of MOS or the thickness of the oxide film.

The electrode pads 4 and 5 are staggered in the I/O circuit region 2. Some of the electrode pads 4 and 5 are disposed to exceed the I/O circuit region 2. For example, the electrode pads 5 are disposed across the I/O circuit region 2 and the internal circuit region 3. The electrode pads 4 and 5 are electrically connected to the I/O circuits disposed in the I/O circuit region 2, for example. The electrode pads 6 are disposed in the internal circuit region 3. The electrode pads 6 are electrically connected to the internal circuits disposed in the internal circuit region 3, for instance. The electrode pads 6 can be used as a pad for backing up power supplied to the internal circuits.

The electrode pads 4, 5, and 6 are connected to external electrode terminals using bumps and wire bonding. Bumps including a Cu pillar bump, an Au bump, a solder bump, and a micro bump can be used as the bump.

Figure 2:
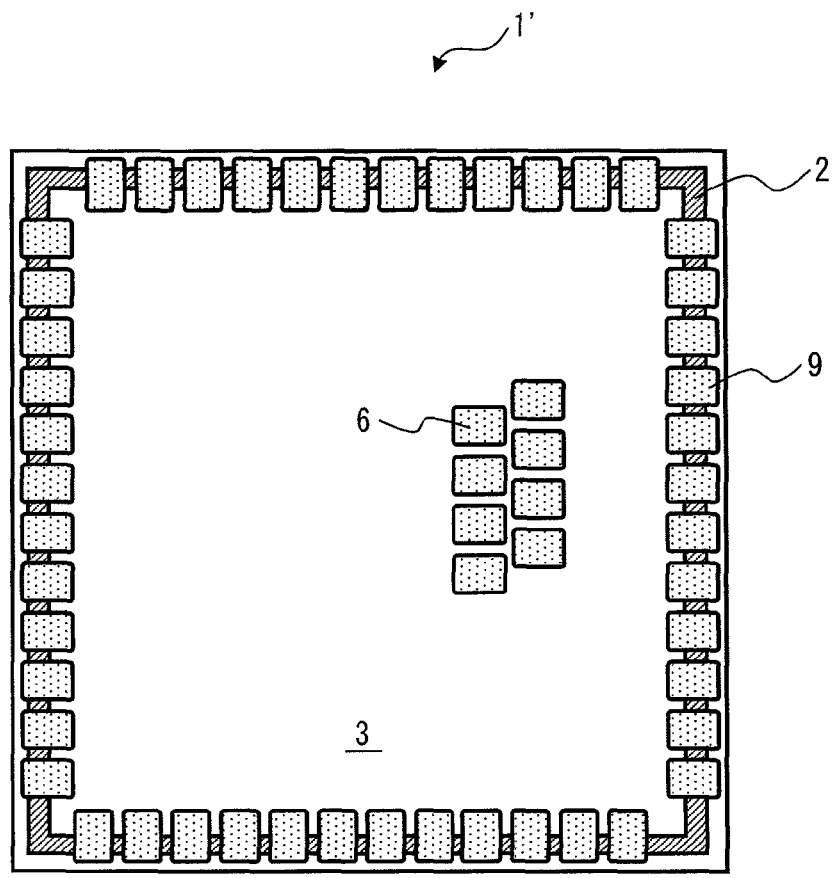
FIG. 2 is a top view showing another example of the semiconductor device according to the first embodiment.

FIG. 2 is a top view showing another example of the semiconductor device according to this embodiment. Also in a semiconductor device 1' shown in FIG. 2, the I/O circuit region 2 is disposed to surround the internal circuit region 3. Moreover, in the semiconductor device 1' shown in FIG. 2, electrode pads 9 are disposed in a line in the I/O circuit region 2. In addition, some of the electrode pads 9 are disposed to exceed the I/O circuit region 2. For example, the electrode pads 9 are disposed across the I/O circuit region 2 and the internal circuit region 3.

Figure 3:
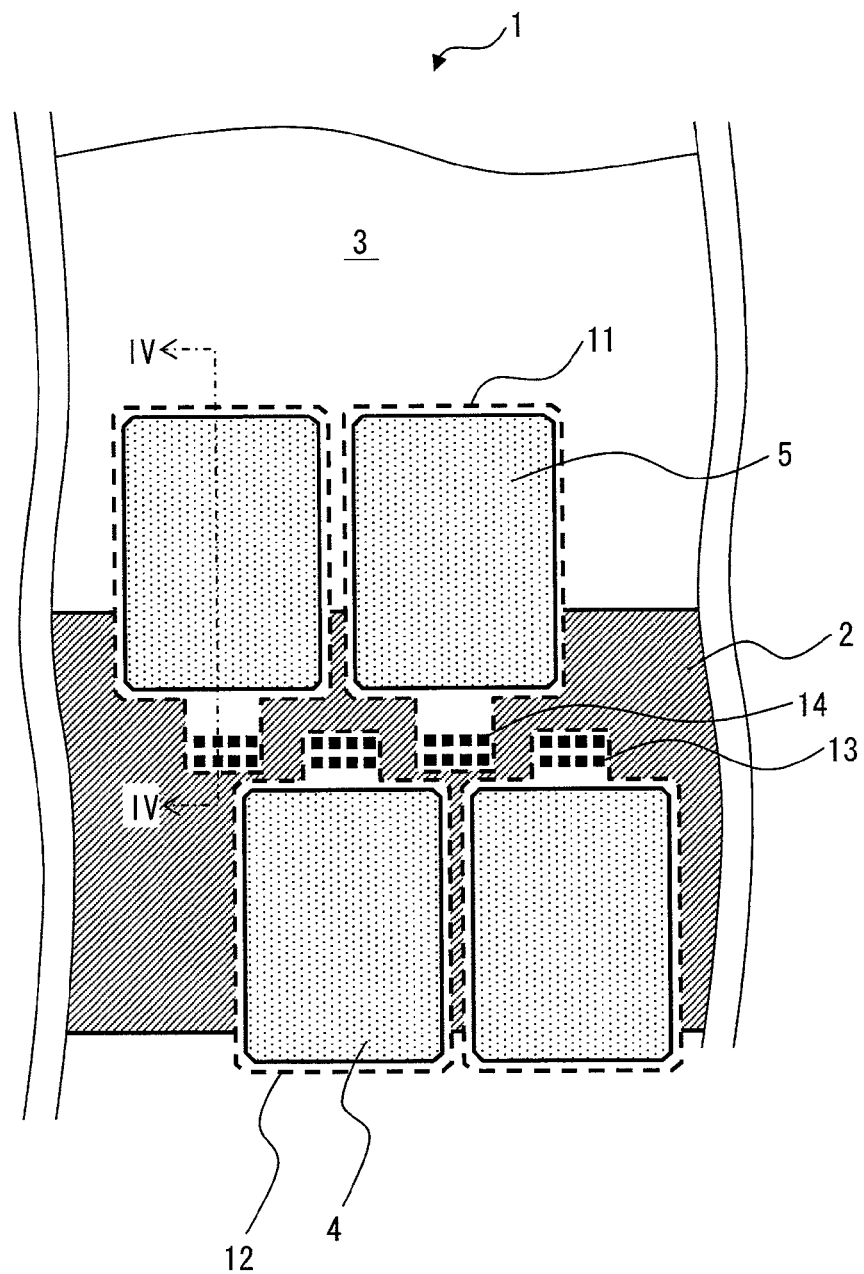
FIG. 3 is an enlarged diagram showing periphery of electrode pads of the semiconductor device shown in FIG. 1.

FIG. 3 is an enlarged diagram showing the periphery of the electrode pads 4 and 5 of the semiconductor device 1 shown in FIG. 1. As shown in FIG. 3, the electrode pad 4 can be formed by creating an opening in a part of a conductor pattern 12 (for example, metal aluminum). In other words, an insulating film is formed on the conductor pattern 12 except for the parts of the electrode pads 4 on the conductor pattern 12. Vias 13 are provided in projected parts of longitudinal ends of the conductive pattern 12. The electrode pads 4 are electrically connected to the I/O circuits formed in the I/O circuit region 2 through the vias 13.

Similarly, the electrode pad 5 can be formed by creating an opening in a part of a conductor pattern 11 (for example, metal aluminum). In other words, an insulating film is formed on the conductor pattern 11 except for the parts of the electrode pads 5 on the conductor pattern 11. Vias 14 are provided in projected parts of longitudinal ends of the conductor pattern 11. The electrode pads 5 are electrically connected to the I/O circuit formed in the I/O circuit region 2 through the vias 14. The electrode pads 5 are disposed across the I/O circuit region 2 and the internal circuit region 3.

Figure 4:
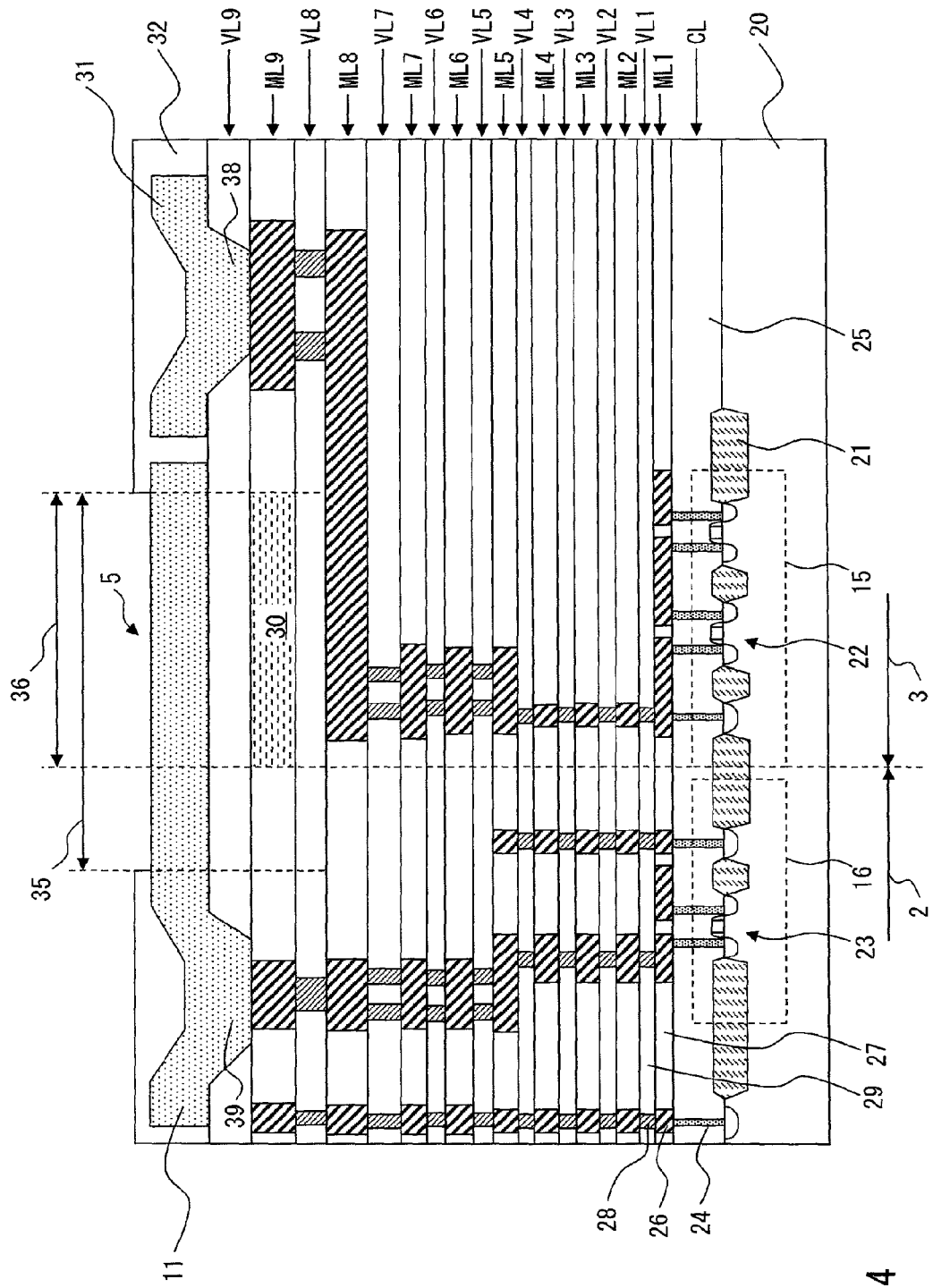
FIG. 4 is a cross-sectional diagram of the semiconductor device according to the first embodiment taken along the line IV-IV of the semiconductor device shown in FIG. 3.

FIG. 4 is a cross-sectional diagram taken along the line IV-IV of the semiconductor device shown in FIG. 3. As shown in FIG. 4, the semiconductor device includes a substrate 20, a contact layer CL, wiring layers ML1 to ML9, via layers VL1 to VL9, and an electrode pad 5. The wiring layers ML1 to ML9 and the via layers VL1 to VL9 compose a multilayer wiring layer.

A p-type silicon single crystal can be used for the substrate 20, for example. Grooved separation parts 21, for example, are formed in the surface of this substrate 20. The separation parts 21 can be formed by embedding an insulating film, such as silicon oxide, in the grooves formed in the surface of the substrate 20. A circuit element 22 (first circuit element) and a circuit element 23 (second circuit element) are formed in regions surrounded by the separation parts 21. The circuit element 22 is formed in a first circuit region 15. The first circuit region 15 is a region included in the internal circuit region 3. Moreover, the circuit element 23 is formed in a second circuit region 16. The second circuit region 16 is a region included in the I/O circuit region 2. The circuit element 23 is less susceptible to the stress as compared to the circuit element 22, and is evaluated in the point that there is no characteristics problem when the stress is imposed on the circuit element 23 as the relative position with the pads is fixed.

The circuit elements 22 and 23 are field effect transistors (FET), for example. The circuit elements 22 and 23 have a pair of semiconductor regions for the source and the drain formed on the surface of the substrate 20, a gate insulating film formed on the surface of the substrate 20 between the pair of semiconductor regions, and a gate electrode formed on the gate insulating film.

The contact layer CL is formed on the surface of the substrate 20. The contact layer CL is a layer for connecting the circuit elements 22 and 23 formed on the surface of the substrate 20 to conductor patterns 26 formed in the wiring layer ML1. The contact layer CL includes plugs 24 and an interlayer insulating film 25. The plugs 24 can be formed by embedding a conductive member in through holes formed in the interlayer insulating film 25. Tungsten can be used for the conductive member that forms the plugs 24, for example. Moreover, a barrier metal may be formed between the plugs 24 and the interlayer insulating film 25. A titanium nitride (TiN) film can be used for the barrier metal, for example. The conductor patterns 26 formed in the wiring layer ML1 are electrically connected to the circuit elements 22 and 23 through the plugs 24.

The wiring layer ML1 includes the conductor patterns 26 and an interlayer insulating film 27. The conductor patterns 26 can be formed by embedding a conductive member in grooves formed in the interlayer insulating film 27. Copper can be used for the conductive member that forms the conductor patterns 26, for example. Moreover, a barrier metal may be formed between the conductor patterns 26 and the interlayer insulating film 27. The barrier metal has a function to suppress diffusion of copper in the conductive member and a function to improve adhesion between the conductive member and the insulating film. A laminated film composed of a tantalum (Ta) film formed on a tantalum nitride (TaN) film can be used for the barrier metal. In addition, the tantalum nitride film is in contact with the interlayer insulating film 27, and the tantalum film is in contact with the conductive member.

The via layer VL1 is a layer for connecting the conductor patterns formed in the wiring layer ML1 and the conductor patterns formed in the wiring layer ML2. The via layer VL1 includes vias 28 and an interlayer insulating film 29. The vias 28 can be formed by embedding a conductive member in the through holes formed in the interlayer insulating film 29. Tungsten can be used for the conductive member that forms the vias 28, for example. Moreover, a barrier metal may be formed between the conductor pattern 28 and the interlayer insulating film 29. A titanium nitride (TiN) film can be used for the barrier metal, for example. The conductor patterns formed in the wiring layer ML2 are connected to the conductor patterns formed in the wiring layer ML1 through the vias 28.

In the semiconductor device according to this embodiment, the plurality of above wiring layers ML1 to ML9 and via layers VL1 to VL9 as above are alternately laminated. An Al wiring layer provided with the conductor pattern 11 including the electrode pad 5 and a power supply line 31 is formed on the via layer VL9, and the Al wiring layer is covered with an insulating film 32 except for the part where an opening 35 (electrode pad 5) is formed. In addition, the power supply line 31 and the conductor pattern of the wiring layer ML9 are electrically connected to each other through a via 38 formed in the via layer VL9. Moreover, the conductor pattern 11 and the conductor pattern of the wiring layer ML9 are electrically connected to each other through a via 39 formed in the via layer VL9.

Such a configuration enables the electrode pad 5 and the circuit element 23 to be electrically connected. This further enables the power supply line 31 and the circuit element 22 to be electrically connected. For example, in the semiconductor device according to this embodiment, the wiring layers ML1 to ML7 may be mainly used as signal wiring, and the wiring layers ML8 and ML9 may be mainly used as power supply wiring. By using the wiring layers ML1 to ML7 that are close to the circuit elements 22 and 23 mainly for the signal wiring and the wiring layers ML8 and ML9 with large film thickness and low resistance mainly for the power supply wiring, it is possible to efficiently supply power to the circuit elements 22 and 23.

In the semiconductor device according to this embodiment, an interlayer insulating film 30 is formed in a region 36 of the top wiring layer ML9 (first wiring layer) among the plurality of wiring layers ML1 to ML9 (i.e., a region where the electrode pad 5 and the first circuit region 15 overlap in a planar view of the electrode pad 5). In other words, in the semiconductor device according to this embodiment, the interlayer insulating film 30 may be formed in the region 36 of the wiring layer ML9, and a conductor pattern or an interlayer insulating film may be formed in the wiring layer ML9 except for the region 36. Note that the planar view of the electrode pad 5 indicates viewing the electrode pad 5 from the normal direction of the principal plane of the electrode pad 5.

By forming the interlayer insulating film 30 in the region 36 of the top wiring layer ML9, it is possible to suppress deterioration in the characteristics of the circuit element 22 caused by the stress imposed on the electrode pad 5. Specifically, the interlayer insulating film 30 functions as a stress relief layer.

As explained in Background, upon inspection of the electrical properties of the semiconductor device, as the electrode pad is brought into contact with the probe of the inspection device, large stress is imposed on the electrode pad. The stress arising from the contact with the probe could damage the circuit elements formed on the semiconductor device. For this reason, constraints are required in the layout of the circuit elements such that the circuit elements should not be disposed below the electrode pad.

However, recent development in microfabrication techniques contributes to reduction in the size of the circuit elements and thus reduction in the chip size. Meanwhile, the number of the electrode pads of the semiconductor device increases along with the increase in the number of functions of the semiconductor device. Consequently, there has been a problem that the ratio of the area occupied by the electrode pads on the chip area increases, and the constraints on the layout of the circuit elements in light of the positions of the electrode pads inhibit the reduction in the chip size.

That is, the size of the chip can be reduced by reducing the size of a MOS device, however the number of electrode pads will not be reduced because of the increase in the number of functions of the semiconductor device. Thus, it is necessary to increase the density of the electrode pads by reducing the size and pitch of the electrode pads. However, as an expensive inspection device and a PKG substrate are required to realize higher density of the electrode pads, the increase in the density of the electrode pads cannot catch up with the speed of reduction in the size of the MOS device. As a consequence, the area of the I/O circuit region will be smaller relative to the size of the electrode pad, and the electrode pad thus exceeds the I/O circuit region.

Due to the large stress from the probe of the inspection device applied to the electrode pad, constraints are required in the layout of the circuit elements such that the circuit elements should not be disposed below the electrode pad. When the electrode pad exceeds the I/O circuit region, this constraint also influences the internal circuit region other than the I/O circuit region. That is, the internal circuits cannot be disposed in the internal circuit region below the electrode pads even with the reduced area of the I/O circuit region. For this reason, the region used as the I/O circuit region is not practically reduced, thereby leading to a problem that inhibits the reduction in the chip size.

Figure 5:
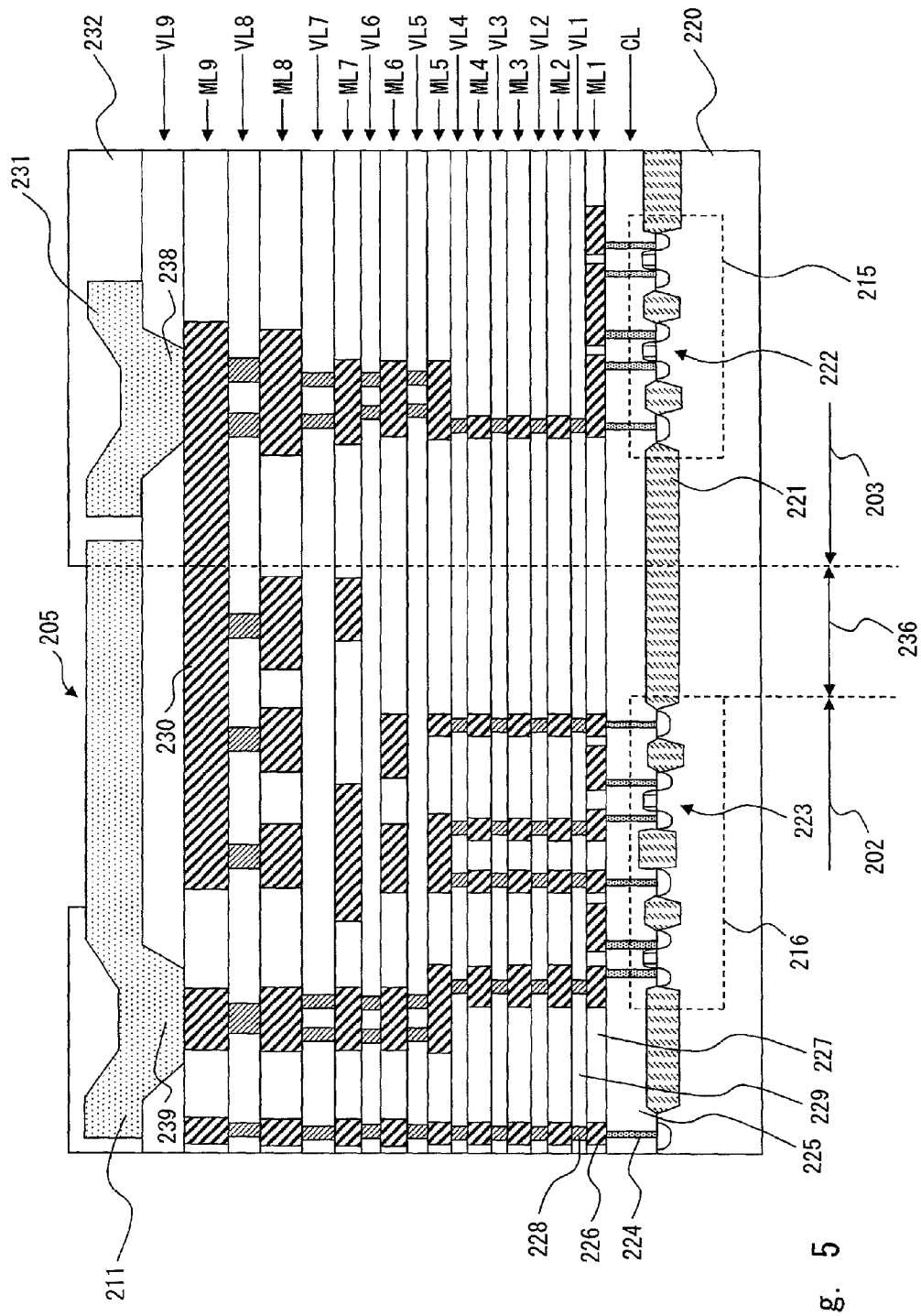
FIG. 5 is a cross-sectional diagram for explaining a comparative example.

FIG. 5 is a cross-sectional diagram for explaining a comparative example of this embodiment. The cross-sectional diagram shown in FIG. 5 corresponds to the cross-sectional diagram shown in FIG. 4, and the same components as in FIG. 4 are denoted by 200s numerals. In the comparative example shown in FIG. 5, in the wiring layer ML9, a conductor pattern 230 is formed in the part immediately below an electrode pad 205. With the conductor pattern 230 provided in the wiring layer ML9 immediately below the electrode pad 205 in this way, when the probe of the inspection device is brought into contact with the electrode pad 205, the stress imposed on the electrode pad 205 is transmitted down to the wiring layers ML1 to ML8, the via layers VL1 to VL8, and the substrate 220.

Since the circuit element 223 composes the I/O circuit, the circuit element 223 is relatively insusceptible to stress. Accordingly, a second region 216 where the circuit element 223 is formed can be disposed to a position to overlap the electrode pad 205 in a planar view of the electrode pad 205. The relative position of the elements composing the I/O circuit with the electrode pads is fixed, thus it has been evaluated that the element has no characteristics problem when the stress from the probing operation is imposed thereon. There is no concern on the stress in this regard as well.

Meanwhile, since the circuit element 222 composes the internal circuit, the circuit element 222 is relatively susceptible to the stress. For example, as an oxide film (gate oxide film) composing the internal circuit is thinner than the oxide film composing the I/O circuit, the driving voltage is low. Thus, the transistor characteristics of the transistor composing the internal circuit may fluctuate by the stress imposed thereon. For this reason, a first region 215 where the circuit element 222 is formed must be disposed not to overlap the electrode pad 205 in a planar view of the electrode pad 205. That is, the internal circuit region 203 where the first region 215 is disposed must be at the position not overlapping the electrode pad 205.

Hence, when the electrode pad 205 exceeds the I/O circuit region 202, the internal circuit region 203 cannot be disposed in a region 236 where the electrode pad 205 is exceeding. Consequently, the circuits other than the I/O circuit are unable to be disposed in the region 236 where the electrode pad 205 is exceeding, thereby causing the region 236 to be a dead space. More specifically, even with the reduced area of the I/O circuit region 202, the circuits other than the I/O circuit cannot be disposed in the region 236 where the electrode pad 205 is exceeding, and thus the chip size cannot be reduced.

In the semiconductor device according to this embodiment, the interlayer insulating film 30 is formed in the region 36 of the top wiring layer ML9 among the plurality of wiring layers ML1 to ML9 (i.e., in a region where the electrode pad 5 and the first circuit region 15 overlap in the planar view of the electrode pad 5), as shown in FIG. 4. By the interlayer insulating film 30 formed in the region 36 of the top wiring layer ML9, it is possible to suppress the stress imposed on the electrode pad 5 from transmitting below to the wiring layers ML1 to ML8, the via layers VL1 to VL8, and the substrate 20 when the probe of the inspection device is brought into contact with the electrode pad 5. As a consequence, the circuits other than the I/O circuit (i.e., the internal circuit region 3) can be disposed in the region 36 where the electrode pad 5 is exceeding to efficiently use the region 36, thereby enabling the reduction in the chip size.

For example, a core circuit (logic circuit), an SRAM (Static Random. Access Memory), a power switch and the like can be disposed in the region 36. Note that although an analog circuit (such as a PLL circuit, a regulator circuit and the like) may be disposed in the region 36, as the analog circuit is especially sensitive to the transistor characteristics, it is preferable to dispose the analog circuit in the internal circuit region 3 except in the region 36.

Figure 6:
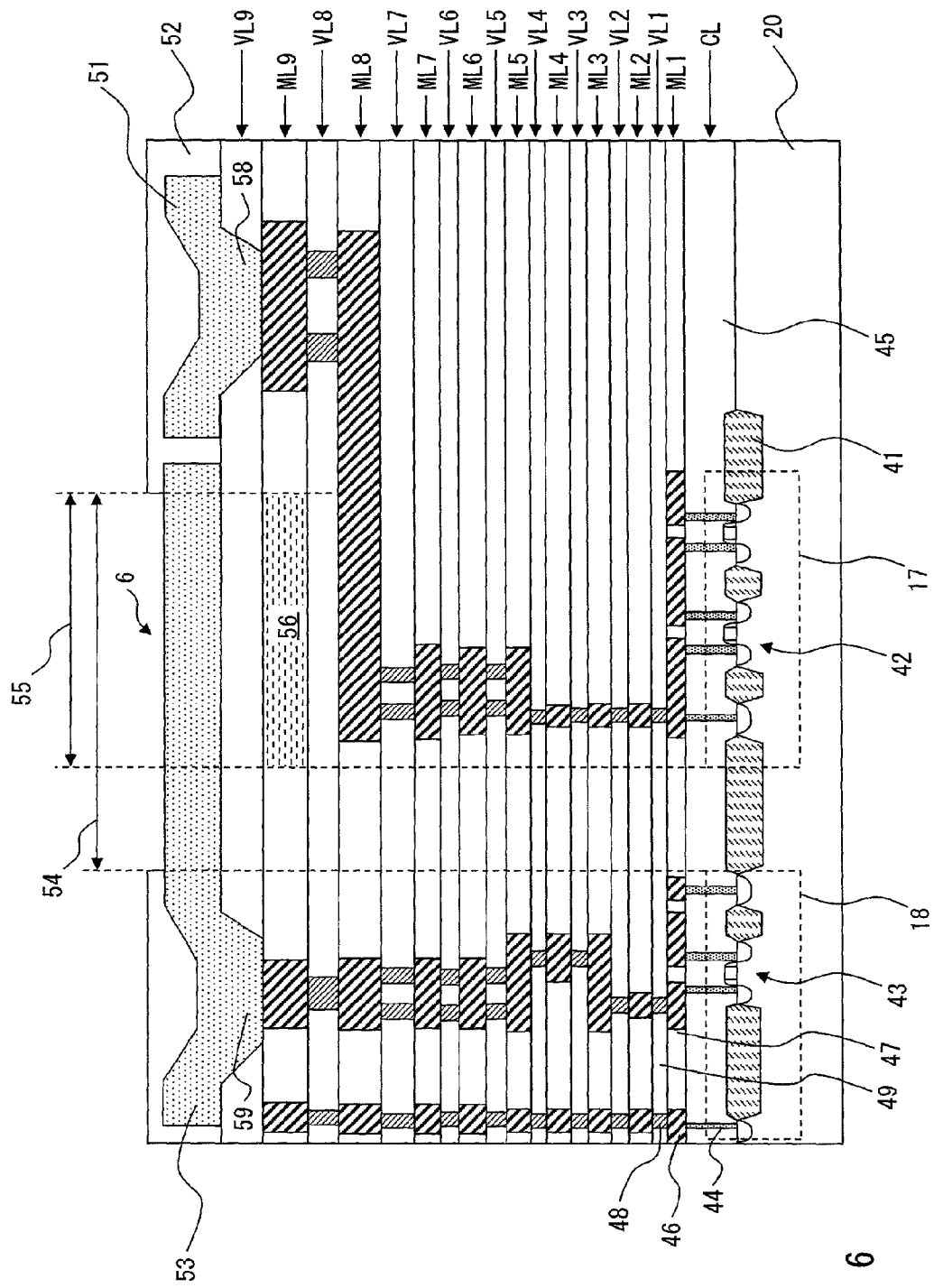
FIG. 6 is a cross-sectional diagram of the semiconductor device according to the first embodiment taken along the line VI-VI of the semiconductor device shown in FIG. 1.

Next, the electrode pad 6 formed in the internal circuit region 3 shown in FIG. 1 is explained. FIG. 6 is a cross-sectional diagram taken along the line VI to VI of the semiconductor device shown in FIG. 1. As shown in FIG. 6, the semiconductor device includes the substrate 20, the contact layer CL, the wiring layers ML1 to ML9, the via layers VL1 to VL9, and the electrode pad 6. The wiring layers ML1 to ML9 and the via layers VL1 to VL9 compose a multilayer wiring layer.

A p-type silicon single crystal can be used for the substrate 20, for example. Grooved separation parts 41, for example, are formed in the surface of this substrate 20. The separation parts 41 can be formed by embedding an insulating film, such as silicon oxide, in the grooves formed in the surface of the substrate 20. Circuit elements 42 and 43 are formed in the regions surrounded by the separation parts 41. The circuit elements 42 and 43 are formed in first circuit regions 17 and 18, respectively. The first circuit regions 17 and 18 are regions included in the internal circuit region 3 (see FIG. 1). That is, the circuit elements 42 and 43 compose the internal circuit.

The circuit elements 42 and 43 are field effect transistors (FET), for example. The contact layer CL is formed on the surface of the substrate 20. The contact layer CL is a layer for connecting the circuit elements 42 and 43 formed on the surface of the substrate 20 and conductor patterns 46 formed in the wiring layer ML1. That is, the conductor patterns 46 formed in the wiring layer ML1 are electrically connected to the circuit elements 42 and 43 through plugs 44. The contact layer CL includes the plugs 44 and an interlayer insulting film 45. Note that the contact layer CL has the same configuration as that of the contact layer CL explained in FIG. 3, thus the explanation will not be repeated here.

The wiring layer ML1 includes the conductor patterns 46 and an interlayer insulating film 47. Note that the wiring layer ML1 also has the same configuration as the wiring layer ML1 explained in FIG. 4, thus the explanation will not be repeated here.

The via layer VL1 is a layer for connecting the conductor patterns formed in the wiring layer ML1 and the conductor patterns formed in the wiring layer ML2. That is, the conductor pattern formed in the wiring layer ML2 is connected to the conductor patterns formed in the wiring layer ML1 through vias 48. The via layer VL1 includes the vias 48 and an interlayer insulating film 49. Note that the via layer VL1 also has the same configuration as the via layer VL1 explained in FIG. 4, thus the explanation will not be repeated here.

Also in the semiconductor device shown in FIG. 6, the plurality of wiring layers ML1 to ML9 and via layers VL1 to VL9 as above are alternately laminated. The Al wiring layer provided with the conductor pattern 53 including the electrode pad 6 and a power supply line 51 is formed on the via layer VL9, and the Al wiring layer is covered with an insulating film 52 except for the part where an opening 54 (electrode pad 6) is formed. In addition, the power supply line 51 and the conductor pattern of the wiring layer ML9 are electrically connected to each other through a via 58 formed in the via layer VL9. Moreover, the conductor pattern 53 and the conductor pattern of the wiring layer ML9 are electrically connected to each other through a via 59 formed in the via layer VL9.

Such a configuration enables electrical connection between the electrode pad 6 and the circuit element 43. This further enables the power supply line 51 and the circuit element 42 to be electrically connected. For example, in the semiconductor device according to this embodiment, the wiring layers ML1 to ML7 may be mainly used for signal wiring, and the wiring layers ML8 to ML9 may be mainly used for power supply wiring. By using the wiring layers ML1 to ML7 that are close to the circuit elements 42 and 43 mainly for the signal wiring and the wiring layers ML8 and ML9 with large film thickness and low resistance mainly for the power supply wiring, it is possible to efficiently supply power to the circuit elements 42 and 43.

In the semiconductor device according to this embodiment, an interlayer insulating film 56 is formed in a region 55 of the top wiring layer ML9 among the plurality of wiring layers ML1 to ML9 (i.e., in a region where the electrode pad 6 and the first circuit region 17 overlap in a planar view of the electrode pad 6). In other words, in the semiconductor device according to this embodiment, the interlayer insulating film 56 may be formed in the region 55 of the wiring layer ML9, a conductor pattern or an interlayer insulating film may be formed on the wiring layer ML9 except for the region 55.

By forming the interlayer insulating film 56 in the region 55 of the top wiring layer ML9, it is possible to suppress the characteristics of the circuit element 42 from deteriorating caused by the stress imposed on the electrode pad 6. That is, the interlayer insulating film 56 functions as a stress relief layer.

The interlayer insulating film 56 formed to all the parts of the wiring layer ML9 that overlap the electrode pad 6 allows the most efficient utilization of the space below the electrode pad 6.

Figure 7:
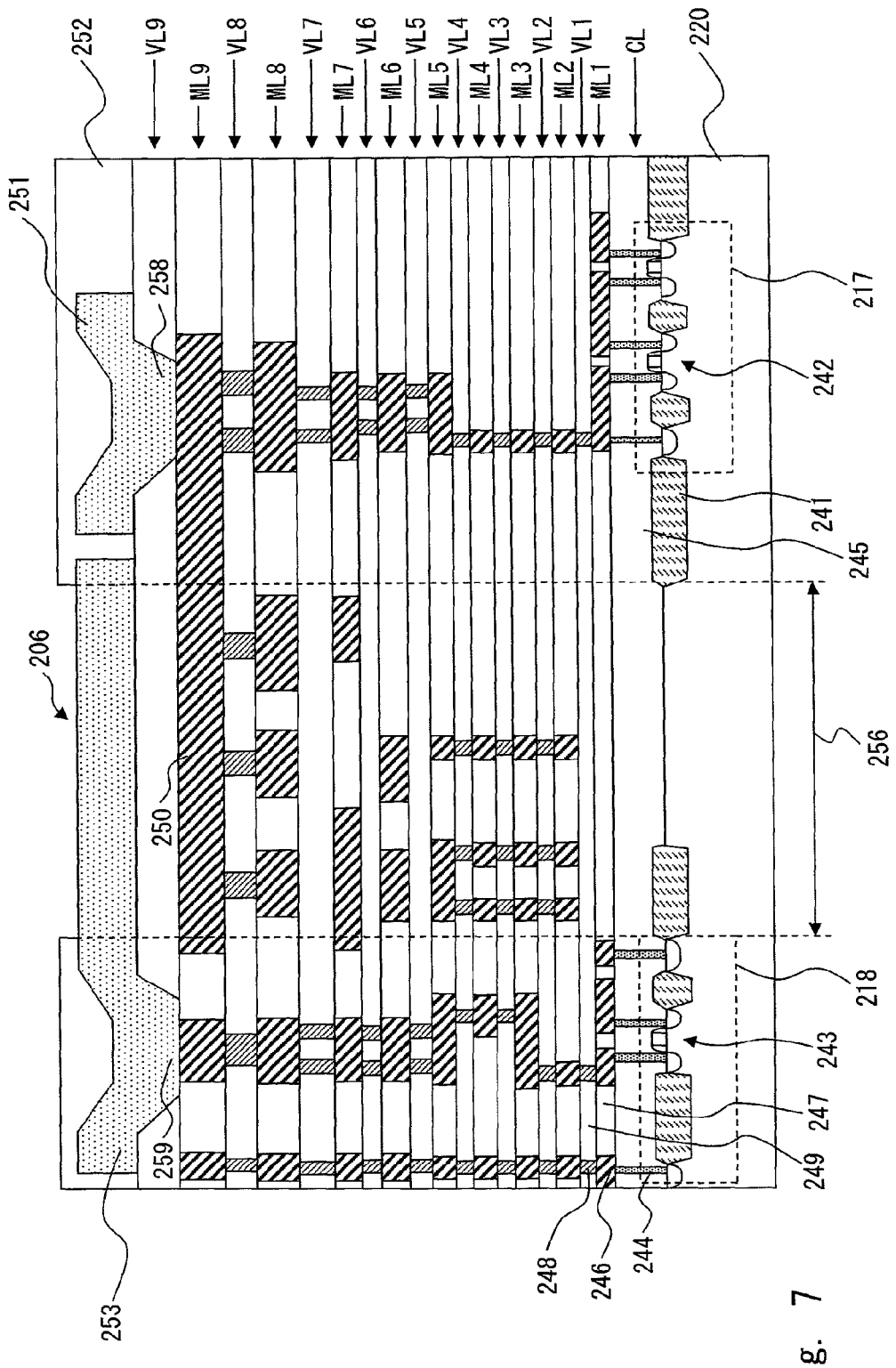
FIG. 7 is a cross-sectional diagram for explaining a comparative example.

FIG. 7 is a cross-sectional diagram for explaining a comparative example according to this embodiment. The cross-sectional diagram showing in FIG. 7 corresponds to the cross-sectional diagram shown in FIG. 6, and the same components as in FIG. 6 are denoted by 200's numerals. In the comparative example shown in FIG. 7, the conductor pattern 250 is formed in the part immediately below the electrode pad 206 of the wiring layer ML9. With the conductor pattern 250 provided on the wiring layer ML9 which is immediately below the electrode pad 206, the stress imposed on the electrode pad 206 is transmitted down to the wiring layers ML1 to ML8, the via layers VL1 to VL8, and the substrate 220 when the probe of the inspection device is brought into contact with the electrode pad 206.

Since circuit elements 242 and 243 compose the internal circuit, the circuit elements 242 and 243 are relatively susceptible to the stress. Accordingly, the transistor characteristics of the transistor composing the internal circuit may fluctuate by the stress to be imposed. For this reason, it is necessary to dispose the first regions 217 and 218 where the circuit elements 242 and 243 are formed therein so as not to overlap the electrode pad 206 in a planar view of the electrode pad 206. In other words, the circuit element composing the internal circuit cannot be disposed in a region 256 where the electrode pad 206 is disposed. For this reason, the region 256 where the electrode pad 206 is disposed will be a dead space.

In the semiconductor device according to this embodiment, the interlayer insulating film 56 is formed in the region 55 of the top wiring layer ML9 among the plurality of wiring layers ML1 to ML9 (i.e., in a region where the electrode pad 6 and the first circuit region 17 overlap in a planar view of the electrode pad 6). By the interlayer insulating film 56 formed in the region 55 on the top wiring layer ML9, it is possible to suppress the stress imposed on the electrode pad 6 from transmitting down to the wiring layers ML1 to MLB, the via layers VL1 to VL8, and the substrate 20 when the probe of the inspection device is brought into contact with the electrode pad 6. As a consequence, the circuit composing the internal circuit can be disposed in the region 54 where the electrode pad 6 is disposed to efficiently use the region 54, thereby enabling the reduction in the chip size.

For example, a core circuit (logic circuit), an SRAM (Static Random Access Memory), a power switch and the like can be disposed in the region 55. Note that an analog circuit (such as a PLL circuit, a regulator circuit and the like) may be disposed in the region 55. However the analog circuit is especially sensitive to the transistor characteristics. Thus it is preferable to dispose the analog circuit in the internal circuit region 3 except in the region 55.

According to this embodiment explained above, it is possible to provide a semiconductor device and a manufacturing method for the semiconductor device that realize the reduction in the chip size.

Second Embodiment

Next, a second embodiment is explained. In a semiconductor device according to this embodiment, a probing region and an external electrode connection region are provided on the electrode pad. Other configurations are similar to the semiconductor device according to the first embodiment, thus the same components are denoted by the same reference numerals and the explanation will not be repeated here as appropriate.

Figure 8:
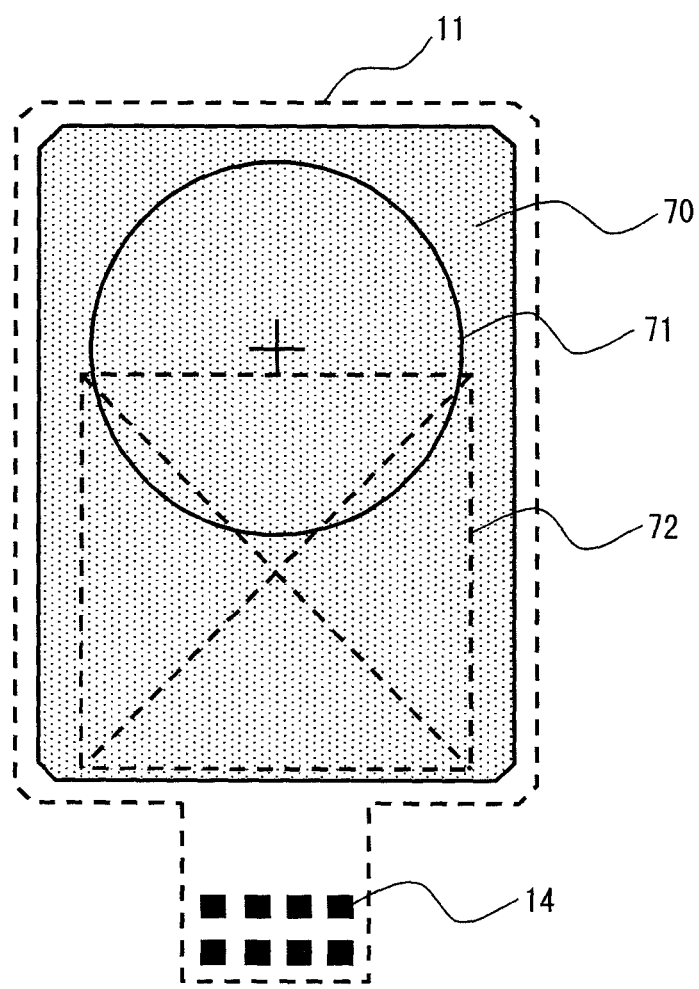
FIG. 8 is a top view showing an electrode pad included in a semiconductor device according to a second embodiment.

FIG. 8 is a top view showing an electrode pad included in the semiconductor device according to this embodiment. As shown in FIG. 8, an electrode pad 70 can be formed by creating an opening in a part of the conductor pattern 11 (for example, metal aluminum). In other words, an insulating film is formed on the conductor pattern 11 except for part of the electrode pad 70 on the conductor pattern 11. The vias 14 are provided in projected parts of longitudinal ends of the conductor pattern 11.

Moreover, the electrode pad 70 includes an external electrode connection region 71 and a probing region 72. The external electrode connection region 71 is connected to external electrode terminals using bumps and wire bonding. Moreover, the probing region 72 is a region to be in contact with the probe of the inspection device. The probing region 72 is a region to be in contact with the probe of the inspection device, thus larger stress is imposed on the probing region 72 than the stress imposed on the external electrode connection region 71.

In FIG. 8, although a part of the external electrode connection region 71 and a part of the probing region 72 are formed to overlap, the external electrode connection region 71 and the probing region 72 may not overlap. Note that in light of the reduction in the area of the electrode pad 70, it is preferable to overlap the part of the external electrode connection region 71 and the part of the probing region 72.

Figure 9:
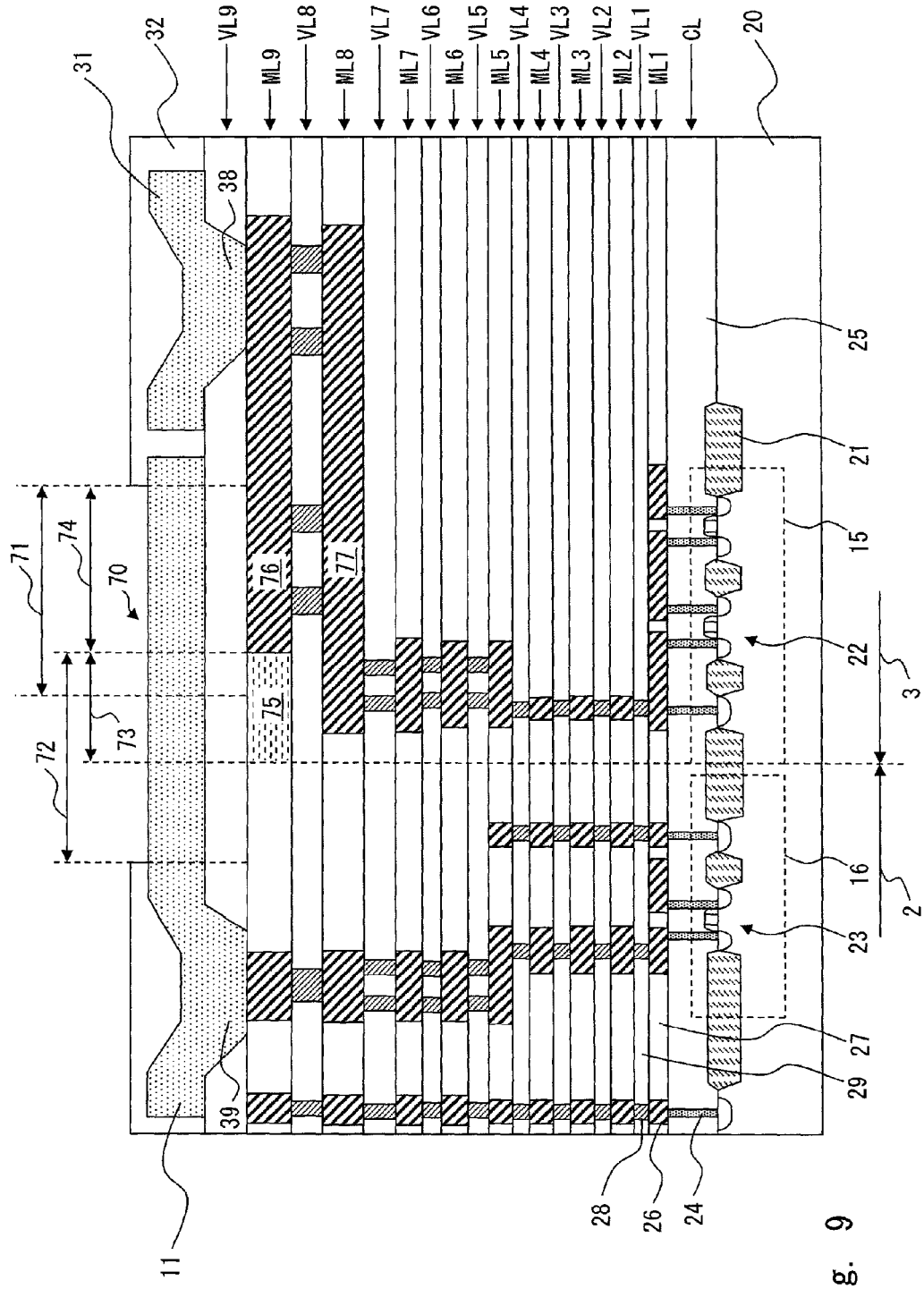
FIG. 9 is a cross-sectional diagram of the semiconductor device according to the second embodiment.

FIG. 9 is a cross-sectional diagram of the semiconductor device according to this embodiment. The cross-sectional diagram shown in FIG. 9 corresponds to the cross-sectional diagram shown in FIG. 4, and the electrode pad 70 is formed across the I/O circuit region 2 and the internal circuit region 3. Note that the same components as in the cross-sectional diagrams of FIG. 4 are denoted by the same reference numerals.

As shown in FIG. 9, the semiconductor device includes the substrate 20, the contact layer CL, the wiring layers ML1 to ML9, the via layers VL1 to VL9, and the electrode pad 70. The wiring layers ML1 to ML9 and the via layers VL1 to VL9 compose a multilayer wiring layer.

A p-type silicon single crystal can be used for the substrate 20, for example. The grooved separation parts 21, for example, are formed in the surface of this substrate 20. The separation parts 21 can be formed by embedding an insulating film, such as silicon oxide, in the grooves formed in the surface of the substrate 20. The circuit elements 22 and 23 are formed in the regions surrounded by the separation parts 21. The circuit element 22 is formed in the first circuit region 15. The first circuit region 15 is a region included in the internal circuit region 3. Moreover, the circuit element 23 is formed in the second circuit region 16. The second circuit region 16 is a region included in the I/O circuit region 2.

The circuit elements 22 and 23 are field effect transistors (FET), for example. The contact layer CL is formed on the surface of the substrate 20. The contact layer CL is a layer for connecting the circuit elements 22 and 23 formed on the surface of the substrate 20 and the conductor patterns 26 formed in the wiring layer ML1. That is, the conductor patterns 26 formed in the wiring layer ML1 are electrically connected to the circuit elements 22 and 23 via the plugs 24. The contact layer CL includes the plugs 24 and the interlayer insulating film 25. Note that the contact layer CL has the same configuration as the contact layer CL explained in FIG. 4, thus the explanation will not be repeated here.

The wiring layer ML1 includes the conductor patterns 26 and the interlayer insulating film 27. Note that the wiring layer ML1 also has the same configuration as the wiring layer ML1 explained in FIG. 4, thus the explanation will not be repeated here.

The via layer VL1 is a layer for connecting the conductor patterns formed in the wiring layer ML1 and the conductor patterns formed in the wiring layer ML2. That is, the conductor patterns formed in the wiring layer ML2 are connected to the conductor patterns formed in the wiring layer ML1 through the vias 28. The via layer VL1 includes the vias 28 and the interlayer insulating film 29. Note that the via layer VL1 also has the same configuration as the via layer VL1 explained in FIG. 4, thus the explanation will not be repeated here.

Also in the semiconductor device shown in FIG. 9, the plurality of wiring layers ML1 to ML9 and via layers VL1 to VL9 as above are alternately laminated. The Al wiring layer provided with the conductor pattern 11 including the electrode pad 70 and the power supply line 31 is formed on the via layer VL9, and the Al wiring layer is covered with the insulating film 32 except for the part where an opening (electrode pad 70) is formed. In addition, the power supply line 31 and a conductor pattern 76 of the wiring layer ML9 are electrically connected to each other through the via 38 formed in the via layer VL9. Moreover, the conductor pattern 11 and the conductor pattern of the wiring layer ML9 are electrically connected to each other through the via 39 formed in the via layer VL9.

Such a configuration enables electrical connection between the electrode pad 6 and the circuit element 43. This further enables the power supply line 31 and the circuit element 22 to be electrically connected. For example, in the semiconductor device according to this embodiment, the wiring layers ML1 to ML7 may be mainly used for signal wiring, and the wiring layers ML8 to ML9 may be mainly used for power supply wiring. By using the wiring layers ML1 to ML7 that are close to the circuit elements 22 and 23 mainly for the signal wiring and the wiring layers ML8 and ML9 with large film thickness and low resistance mainly for the power supply wiring, it is possible to efficiently supply power to the circuit elements 22 and 23.

Moreover, the electrode pad 70 included in the semiconductor device according to this embodiment has the external electrode connection region 71 to be connected to an external electrode terminal using a bump or wire bonding and the probing region 72 to be in contact with the probe of the inspection device. The probing region 72 is a region to be in contact with the probe of the inspection device, thus larger stress is imposed on the probing region 72 than the stress imposed on the external electrode connection region 71.

In the semiconductor device according to this embodiment, an interlayer insulating film 75 is formed in a region 73 of the top wiring layer ML9 among the plurality of wiring layers ML1 to ML9 (i.e., in a region where the probing region 72 of the electrode pad 70 and the first circuit region 15 overlap in a planar view of the electrode pad 70). By forming the interlayer insulating film 75 in the region 73 on the top wiring layer ML9, it is possible to suppress the characteristics of the circuit element 22 from deteriorating caused by the stress imposed on the probing region 72. That is, the interlayer insulating film 75 function as a stress relief layer. As a consequence, the circuit other than the I/O circuit (i.e., the internal circuit region 3) can be disposed in the region 73 where the electrode pad 6 is disposed to efficiently use the region 73, thereby enabling the reduction in the chip size.

For example, in the comparative example shown in FIG. 5, only the I/O circuit that is not susceptible to the stress can be disposed below the electrode pad 205, and the core circuit (logic circuit), an SRAM, a power supply switch, and an analog circuit cannot be disposed. On the other hand, the interlayer insulating film 75 is formed in the region 73 of the top wiring layer ML9 in the semiconductor device according to this embodiment. For this reason, the core circuit (logic circuit), the SRAM, and the power supply switch, which are relatively susceptible to the stress, can be disposed in the region 73. Note that a region 74 that does not overlap the probing region 73 in the external electrode connection region 71 of the electrode pad 70 is a region not susceptible to the stress by the probe. Therefore, in the region 74, an analog circuit (such as a PLL circuit, a regulator circuit and the like) that is sensitive to the transistor characteristics can be disposed in addition to the core circuit (logic circuit), the SRAM, and the power supply switch.

In the semiconductor device shown in FIG. 9, the conductor pattern 76 (first conductor pattern) is formed in the wiring layer ML9 of the region 74 where a region other than probing region 72 and the first circuit region 15 overlap. Moreover, a conductor pattern 77 (second conductor pattern) of the wiring layer ML8 is formed across the external electrode connection region 71 and the probing region 72. The power supplied from the power supply line 31 is supplied to the circuit element 22 through the conductor pattern 76 of the wiring layer ML9 and the conductor pattern 77 of the wiring layer ML8. Thus electric resistance in the wiring layers ML8 and ML9 can be reduced by providing the conductor pattern 76 of the wiring layer ML9 until the end part of the probing region 72.

Figure 10:
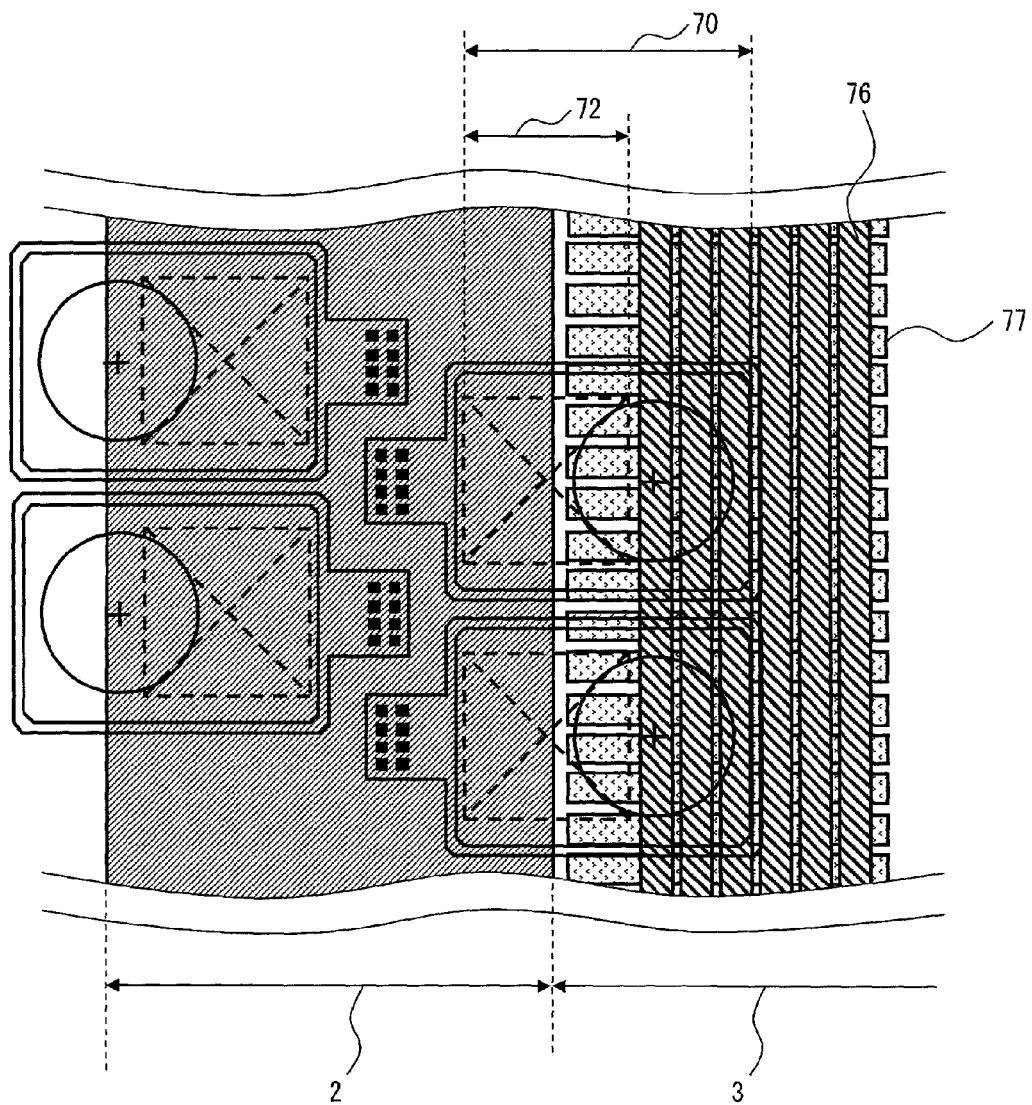
FIG. 10 is a top view of the semiconductor device according to the second embodiment.
Figure 11:
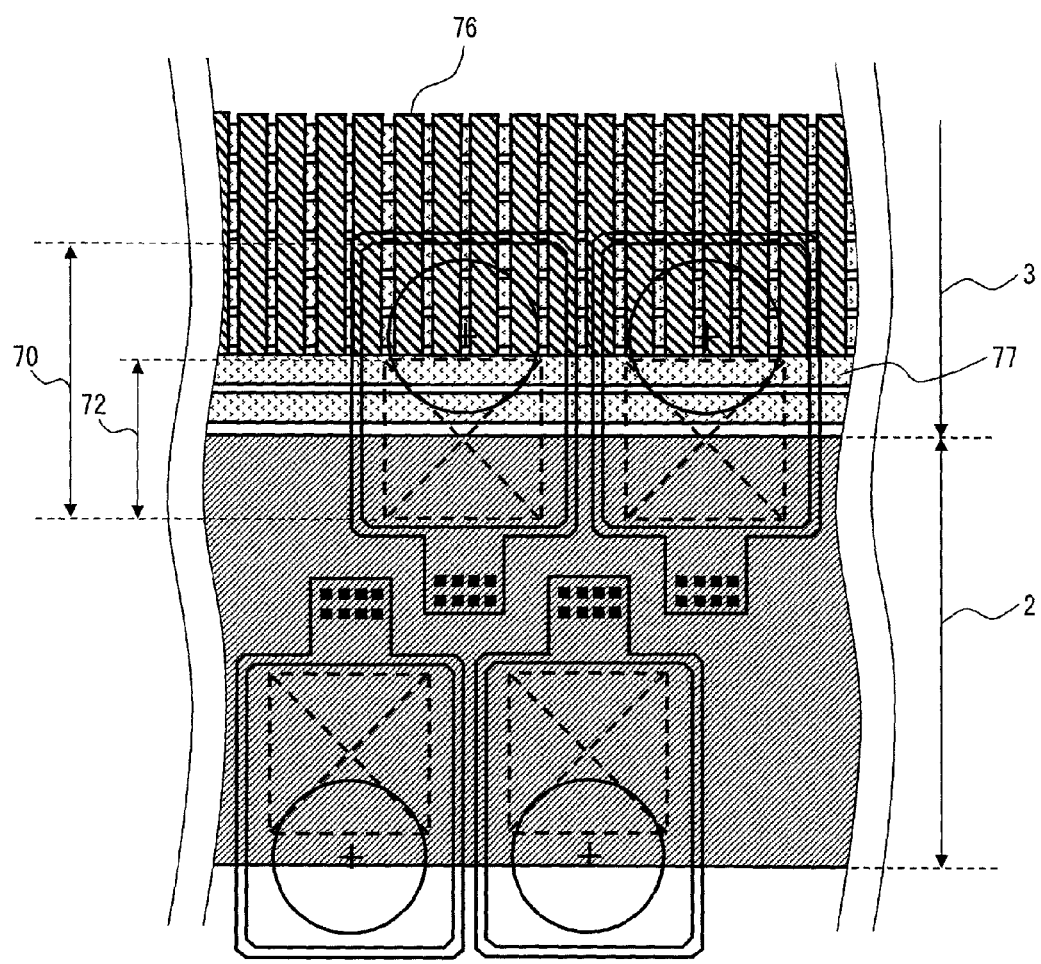
FIG. 11 is a top view of the semiconductor device according to the second embodiment.

FIGS. 10 and 11 are top views of the semiconductor device according to this embodiment. FIGS. 10 and 11 show the positional relationship between the region 70 where the electrode pads are formed, the probing region 72, the conductor patterns 76 of the wiring layer ML9, and the conductor patterns 77 of the wiring layer ML8. Other components are not shown in FIGS. 10 and 11. FIG. 10 shows the periphery of the electrode pads provided on the left hand side of the semiconductor device shown in FIG. 1. Moreover, FIG. 11 shows the periphery of the electrode pads provided on the lower part of the semiconductor device shown in FIG. 1.

In the I/O circuit region 2 of the semiconductor device, power supply main lines (not shown) are disposed surrounding in parallel with the sides around the semiconductor device. However, in the internal circuit region 3, as power supply main lines, the conductor patterns 76 of the wiring layer ML9 are provided in the vertical direction of the drawing, and the conductor patterns 77 of the wiring layer ML8 are provided in the horizontal direction of the drawing in the internal circuit region 3. In addition, the conductor patterns 77 of the wiring layer ML8 are formed also in the probing region 72 near the electrode pads shown in FIG. 10. On the other hand, the conductor patterns 76 of the wiring layer ML9 are formed until the end part of the probing region 72 (i.e., the conductor pattern 76 is not formed in the probing region 72). Moreover, the conductor patterns 77 of the wiring layer ML8 are formed also in the probing region 72 near the electrode pads shown in FIG. 11. Meanwhile, the conductor pattern 76 of the wiring layer ML9 is formed until the end part of the probing region 72.

The probing region 72 of the electrode pad 70 is formed on the I/O circuit region 2 side and the external electrode connection region 71 is formed on the internal circuit region 3 side. This reduces the overlapping part of the probing region 72 and the internal circuit region 3, and allows the conductor patterns 76 of the wiring layer ML9 to be provided near the end part of the internal circuit region 3. Such a configuration enables reduction in the electric resistance of the wiring layers ML8 and ML9.

In the case shown in FIG. 10, the conductor patterns 77 of the wiring layer ML8 are formed in the horizontal direction of the drawing. Specifically, the conductor patterns 77 of the wiring layer ML8 are formed in the direction vertical to the longitudinal direction of the I/O circuit region 2 (vertical direction of the drawing). Therefore, the power is supplied to the circuit elements disposed below the probing region 72 from many conductor patterns 77. On the other hand, in the case shown in FIG. 11, the conductor patterns 77 of the wiring layer ML8 are formed in the direction parallel to the longitudinal direction of the I/O circuit region 2 (horizontal direction of the drawing). Accordingly, the power is supplied to the circuit elements disposed below the probing region 72 from less conductor patterns 77. Consequently, by providing the conductor patterns 76 of the wiring layer ML9 until the end part of the probing region, an advantage of improving power supply is considered to be more effective in the case shown in FIG. 11 than the case shown in FIG. 10.

Figure 12:
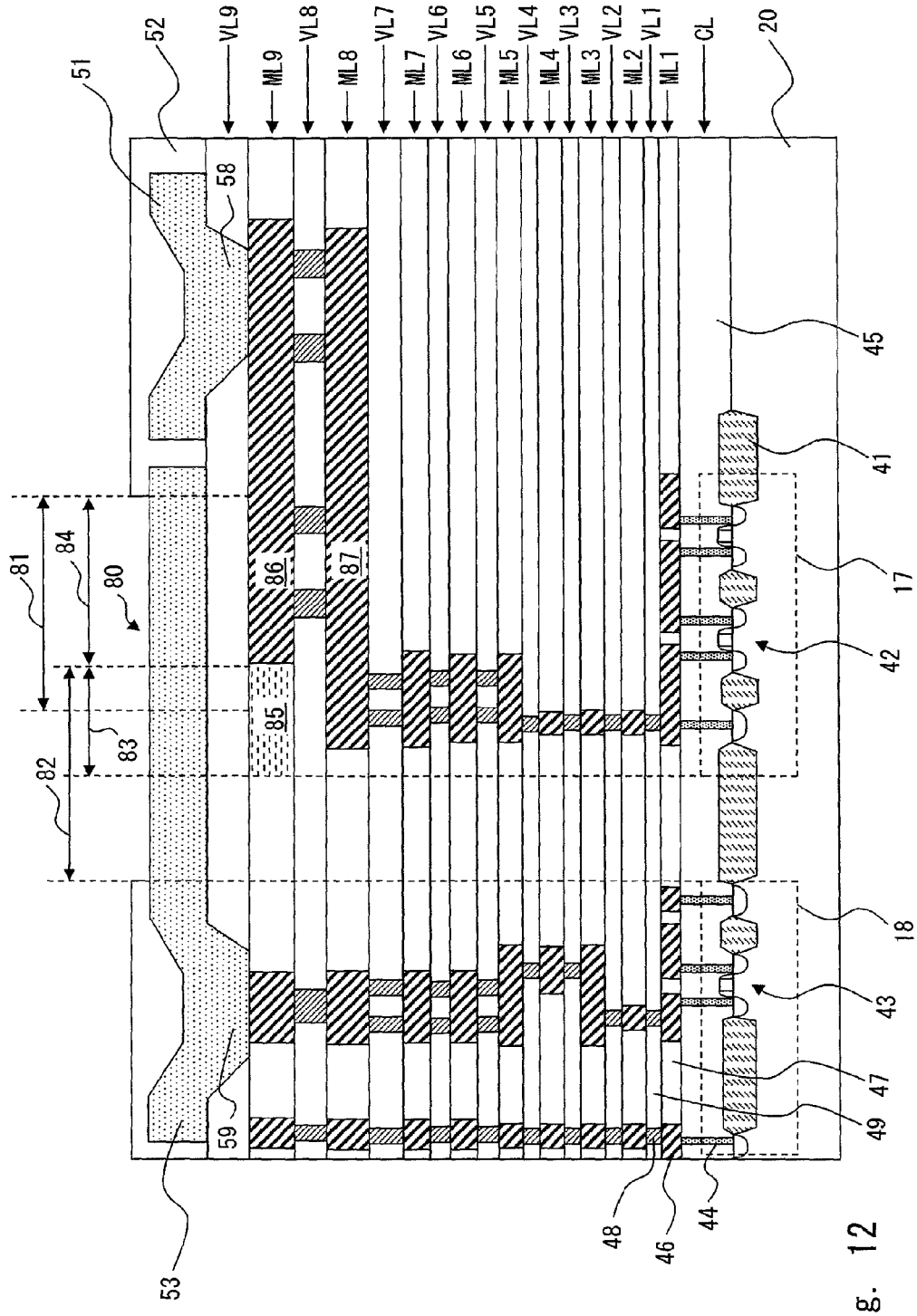
FIG. 12 is a cross-sectional diagram of the semiconductor device according to the second embodiment.

Next, the case is explained in which the electrode pad is formed in the internal circuit region. FIG. 12 is a cross-sectional diagram of the semiconductor device according to this embodiment. The cross-sectional diagram shown in FIG. 12 corresponds to the cross-sectional diagram shown in FIG. 6, and an electrode pad 80 is formed in the internal circuit region 3. Note that the same components as in the cross-sectional diagram shown in FIG. 6 are denoted by the same reference numerals.

As shown in FIG. 12, the semiconductor device has the substrate 20, the contact layer CL, the wiring layers ML1 to ML9, the via layers VL1 to VL9, and the electrode pad 80. The wiring layers ML1 to ML9 and the via layers VL1 to VL9 compose a multilayer wiring layer.

A p-type silicon single crystal can be used for the substrate 20, for example. The grooved separation parts 41, for example, are formed in the surface of this substrate 20. The separation parts 41 can be formed by embedding an insulating film, such as silicon oxide, in the grooves formed in the surface of the substrate 20. The circuit elements 42 and 43 are formed in the regions surrounded by the separation parts 41. The circuit elements 42 and 43 are formed in the first circuit region 17 and 18, respectively. The first circuit regions 17 and 18 are regions included in the internal circuit region 3 (see FIG. 1). That is, the circuit elements 42 and 43 compose the internal circuit.

The circuit elements 42 and 43 are field effect transistors (FET), for example. The contact layer CL is formed on the surface of the substrate 20. The contact layer CL is a layer for connecting the circuit elements 42 and 43 formed on the surface of the substrate 20 and the conductor patterns 46 formed in the wiring layer ML1. That is, the conductor patterns 46 formed in the wiring layer ML1 are electrically connected to the circuit elements 42 and 43 through the plugs 44. The contact layer CL includes the plugs 44 and the interlayer insulating film 45. Note that the contact layer CL has the same configuration as the contact layer CL explained in FIG. 6, thus the explanation will not be repeated here.

The wiring layer ML1 includes the conductor patterns 46 and the interlayer insulating film 47. Note that the contact layer CL also has the same configuration as the wiring layer ML1 explained in FIG. 6, thus the explanation will not be repeated here.

The via layer VL1 is a layer for connecting the conductor patterns formed in the wiring layer ML1 and the conductor patterns formed in the wiring layer ML2. That is, the conductor patterns formed in the wiring layer ML2 are connected to the conductor patterns formed in the wiring layer ML1 through the vias 48. The via layer VL1 includes the vias 48 and the interlayer insulating film 49. Note that the via layer VL also has the same configuration as the via layer VL explained in FIG. 6, thus the explanation will not be repeated here.

Also in the semiconductor device shown in FIG. 12, the plurality of wiring layers ML1 to ML9 and via layers VL1 to VL9 as above are alternately laminated. The Al wiring layer provided with the conductor pattern 53 including the electrode pad 80 and the power supply line 51 is formed on the via layer VL9, and the Al wiring layer is covered with the insulating film 52 except for the part where an opening (electrode pad 80) is formed. In addition, the power supply line 51 and the conductor pattern of the wiring layer ML9 are electrically connected to each other through the via 58 formed in the via layer VL9. Moreover, the conductor pattern 53 and the conductor pattern of the wiring layer ML9 are electrically connected to each other through the via 59 formed in the via layer VL9.

Such a configuration enables electrical connection between the electrode pad 80 and the circuit element 43. This further enables the power supply line 51 and the circuit element 42 to be electrically connected. For example, in the semiconductor device according to this embodiment, the wiring layers ML1 to ML7 may be mainly used for signal wiring, and the wiring layers ML8 to ML9 may be mainly used for power supply wiring. By using the wiring layers ML1 to ML7 that are close to the circuit elements 42 and 43 mainly for the signal wiring and the wiring layers ML8 and ML9 with large film thickness and low resistance mainly for the power supply wiring, it is possible to efficiently supply power to the circuit elements 42 and 43.

Moreover, the electrode pad 80 included in the semiconductor device according to this embodiment includes an external electrode connection region 81 to be connected to an external electrode terminal using a bump and wire bonding and a probing region 82 to be in contact with the probe of the inspection device. The probing region 82 is a region to be in contact with the probe of the inspection device, thus larger stress is imposed on the probing region 82 than the stress imposed on the external electrode connection region 81.

In the semiconductor device according to this embodiment, an interlayer insulating film 85 is formed in a region 83 of the top wiring layer ML9 among the plurality of wiring layers ML1 to ML9 (i.e., in a region where the probing region 82 of the electrode pad 80 and the first circuit region 17 overlap in a planar view of the electrode pad 80). By forming the interlayer insulating film 85 in the region 83 on the top wiring layer ML9, it is possible to suppress the characteristics of the circuit element 42 from deteriorating caused by the stress imposed on the probing region 82. That is, the interlayer insulating film 85 functions as a stress relief layer. Moreover, the internal circuit can be disposed in the probing region 83 of the electrode pad 80 to efficiently use the region 83, thereby enabling the reduction in the chip size.

For example, in the comparative example shown in FIG. 7, a core circuit (logic circuit), an SRAM, a power supply switch, and an analog circuit cannot be disposed below the electrode pad 206. Meanwhile, in the semiconductor device according to this embodiment, the interlayer insulating film 85 is formed in the region 83 of the top wiring layer ML9. Therefore, the core circuit (logic circuit), the SRAM, and the power supply switch, which are relatively susceptible to the stress, can be disposed in the region 83. Note that the region 84 in the external electrode connection region 81 of the electrode pad 80 that does not overlap the probing region 83 is not susceptible to the stress of the probe. Thus, in the region 84, an analog circuit (such as a PLL circuit, a regulator circuit and the like) that is sensitive to the transistor characteristics can be disposed in addition to the core circuit (logic circuit), the SRAM, and the power supply switch.

The interlayer insulating film 85 formed to all the parts of the wiring layer ML9 that overlap the electrode pad 80 allows the most efficient utilization of the space below the electrode pad 80.

In the semiconductor device shown in FIG. 12, the conductor pattern 86 is formed in the region 84 of the wiring layer ML9 where the region other than the probing region 82 and the first circuit region 17 overlap. Further, a conductor pattern 87 of the wiring layer ML8 is formed across the external electrode connection region 81 and the probing region 82. The power supplied from the power supply line 51 is supplied to the circuit element 42 through the wiring layers ML8 and ML9, which are the power supply wiring. Thus the conductor pattern 86 of the wiring layer ML9 formed until the end part of the probing region 82 enables reduction in the electrical resistance of the wiring layers ML8 and ML9.

Figure 13:
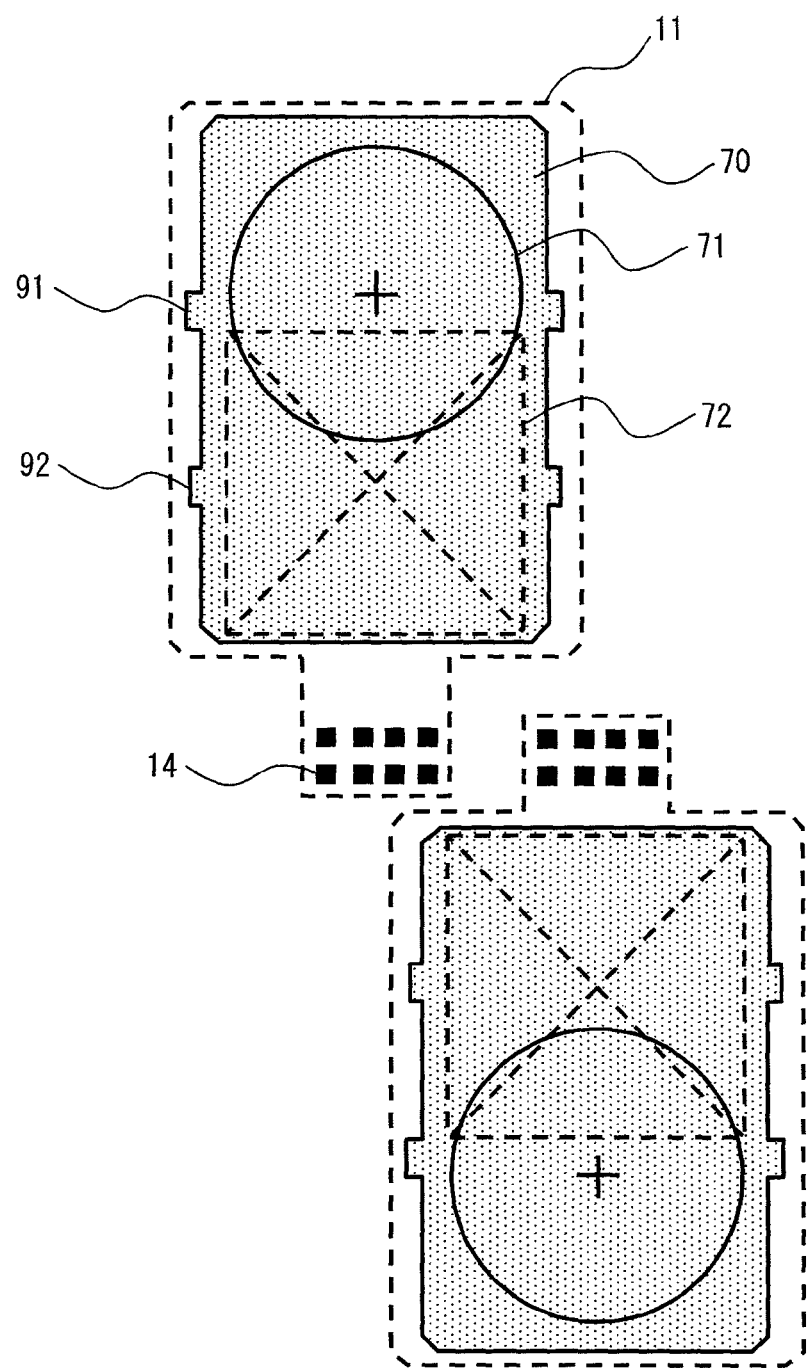
FIG. 13 is a top view showing an example of electrode pads included in the semiconductor device according to the second embodiment.

FIG. 13 is a top view showing an example of the electrode pad included in the semiconductor device according to this embodiment. As shown in FIG. 13, the electrode pad 70 can be formed by creating an opening in a part of the conductor pattern 11 (for example, metal aluminum). In other words, an insulating film is formed on the conductor pattern 11 except for the part of the electrode pad 70 on the conductor pattern 11. The vias 14 are provided in projected parts of longitudinal ends of the conductor pattern 11.

The electrode pad 70 includes the external electrode connection region 71 and the probing region 72. Projections 91 and 92 are formed in the part corresponding to the probing region 72 around the electrode pad 70. That is, the projections 91 and 92 are formed to the sides parallel in the longitudinal direction of the electrode pad 70. The projection 91 is formed at the position corresponding to the end part on the external electrode connection region 71 side of the probing region 72, and the projection 92 is formed at the position corresponding to the central part of the probing region 72. The projections 91 and 92 provided to the electrode pad 70 define the position of the probing region 72 on the electrode pad 70, and further allows accurate contact of the probe of the inspection device with the probing region 72 of the electrode pad 70.

Note that although the electrode pad 70 shown in FIG. 13 includes a total of four projections 91 and 92 on both sides of the probing region 72, the projections 91 and 92 may be provided only on one side of the probing region 72. In such a case, a total of two projections 91 and 92 are provided.

Figure 14:
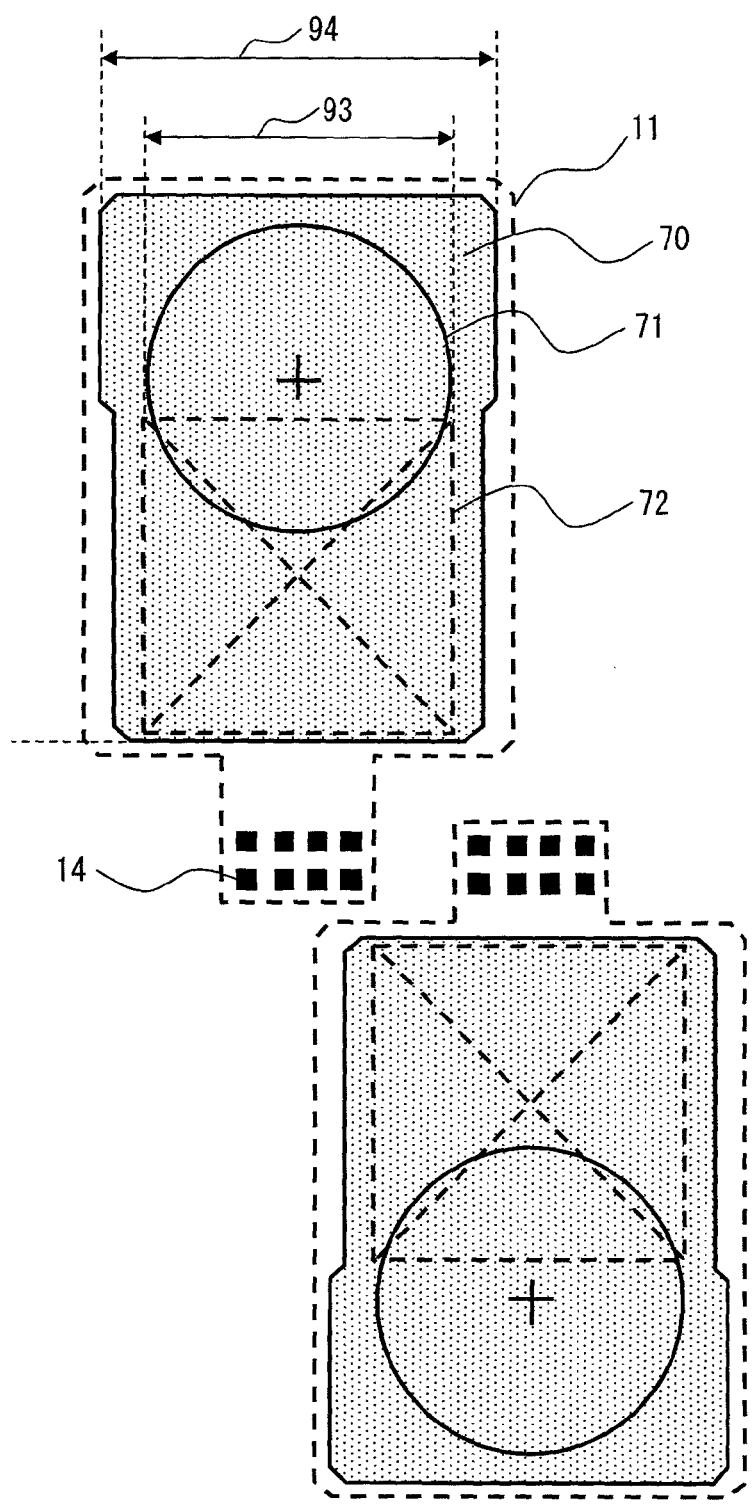
FIG. 14 is a top view showing another example of the electrode pads included in the semiconductor device according to the second embodiment.

Further, as shown in FIG. 14, a width 93 (length in a direction vertical to the longitudinal direction of the electrode pad 70) of the electrode pad 70 in the probing region 72 may be shorter than a width 94 of the electrode pad 70 in the external electrode connection region 71. With the different widths of the electrode pad 70 in the external electrode connection region 71 and the probing region 72 in this way, the position of the probing region 72 can be easily recognized. Note that in this embodiment, the width 93 in the probing region 72 of the electrode pad 70 may be longer than the width 94 in the external electrode connection region 71 of the electrode pad 70.

According to this embodiment explained above, it is possible to provide a semiconductor device and a manufacturing method for the semiconductor device that realize the reduction in the chip size.

This embodiment explained the case, as an example, in which the power supply wiring is disposed in the region other than the probing region below the electrode pad, and the internal circuit is disposed in the region including the probing region below the electrode pad. As the internal circuit, not only an active element including a logic circuit and an SRAM, a passive element such as a decoupling capacitance may be formed. Moreover, the wiring layers ML9 and ML8 can also be used as the signal wiring regions not only as the power supply wiring. Additionally, an active element using metal may be formed in the wiring layers ML1 to ML9 or the wiring layers ML1 to ML9 may be regions for MOM (Metal-Oxide-Metal) capacitance or inductance.

Third Embodiment

Next, a third embodiment is explained. The semiconductor device according to this embodiment is different from the second embodiment in the point that the power supply wiring is formed only on one layer among the plurality of wiring layers. Other configurations are the same as the semiconductor device according to the second embodiment, thus the same components are denoted by the same reference numerals, and the explanation will not be repeated here as appropriate.

Figure 15:
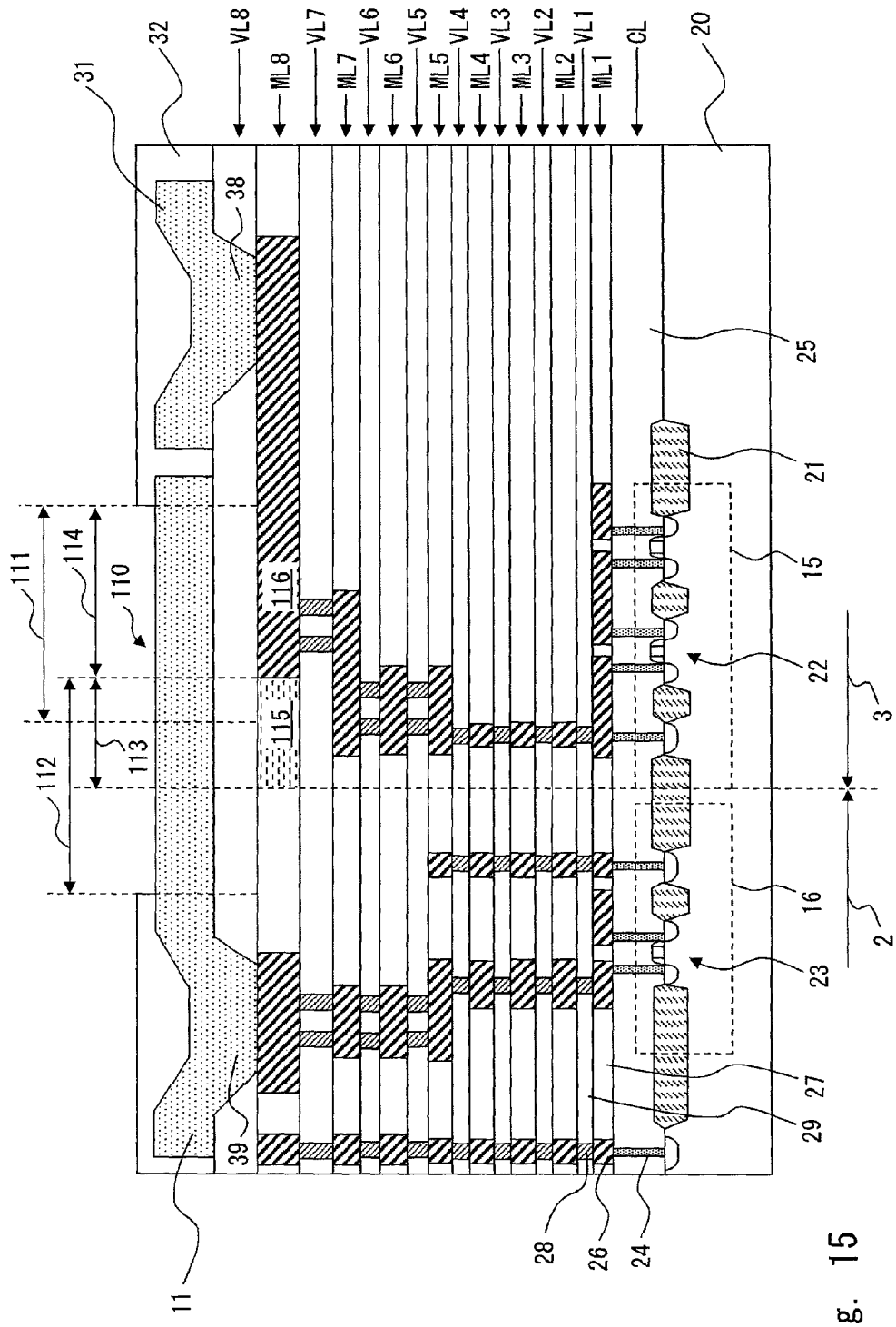
FIG. 15 is a cross-sectional diagram of a semiconductor device according to a third embodiment.

FIG. 15 is a cross-sectional diagram of the semiconductor device according to this embodiment. The cross-sectional diagram shown in FIG. 15 corresponds to the cross-sectional diagram shown in FIG. 9, and an electrode pad 110 is formed across the I/O circuit region 2 and the internal circuit region 3. Note that the same components as in the cross-sectional diagram of FIG. 9 are denoted by the same reference numerals therein.

As shown in FIG. 15, the semiconductor device includes the substrate 20, the contact layer CL, the wiring layers ML1 to ML8, the via layers VL1 to VL8, and the electrode pad 110. The wiring layers ML1 to ML9 and the via layers VL1 to VL9 compose a multilayer wiring layer.

A p-type silicon single crystal can be used for the substrate 20, for example. The grooved separation parts 21, for example, are formed in the surface of this substrate 20. The separation parts 21 can be formed by embedding an insulating film, such as silicon oxide, in the grooves formed in the surface of the substrate 20. The circuit elements 22 and 23 are formed in the regions surrounded by the separation parts 21. The circuit element 22 is formed in the first circuit region 15. The first circuit region 15 is a region included in the internal circuit region 3. Moreover, the circuit element 23 is formed in the second circuit region 16. The second circuit region 16 is a region included in the I/O circuit region 2.

The circuit elements 22 and 23 are field effect transistors (FET), for example. The contact layer CL is formed on the surface of the substrate 20. The contact layer CL is a layer for connecting the circuit elements 22 and 23 formed on the surface of the substrate 20 and the conductor patterns 26 formed in the wiring layer ML1. That is, the conductor patterns 26 formed in the wiring layer ML1 are electrically connected to the circuit elements 22 and 23 through the plugs 24. The contact layer CL includes the plugs 24 and the interlayer insulating film 25. Note that the contact layer CL has the same configuration as the contact layer CL explained in FIG. 9, thus the explanation will not be repeated here.

The wiring layer ML1 includes the conductor patterns 26 and the interlayer insulating film 27. Note that the wiring layer ML also has the same configuration as the wiring layer ML explained in FIG. 9, thus the explanation will not be repeated here.

The via layer VL1 is a layer for connecting the conductor patterns formed in the wiring layer ML1 and the conductor patterns formed in the wiring layer ML2. That is, the conductor patterns formed in the wiring layer ML2 is connected to the conductor patterns formed in the wiring layer ML1 through the vias 28. The via layer VL1 includes the vias 28 and the interlayer insulating film 29. Note that the via layer VL1 also has the same configuration as the via layer VL1 explained in FIG. 9, thus the explanation will not be repeated here.

Also in the semiconductor device shown in FIG. 15, the plurality of wiring layers ML1 to ML9 and via layers VL1 to VL9 as above are alternately laminated. The Al wiring layer provided with the conductor pattern 11 including the electrode pad 110 and the power supply line 31 is formed on the via layer VL8, and the Al wiring layer is covered with the insulating film 32 except for the part where an opening (electrode pad 110) is formed. In addition, the power supply line 31 and a conductor pattern 116 of the wiring layer ML8 are electrically connected to each other through the via 38 formed in the via layer VL8. Moreover, the conductor pattern 11 and the conductor pattern of the wiring layer ML8 are electrically connected to each other through the via 39 formed in the via layer VL8.

Such a configuration enables electrical connection between the electrode pad 110 and the circuit element 33. This further enables the power supply line 31 and the circuit element 22 to be electrically connected. For example, in the semiconductor device according to this embodiment, the wiring layers ML1 to ML7 may be mainly used for signal wiring, and the wiring layer ML8 may be mainly Used for power supply wiring. By using the wiring layers ML1 to ML7 that are close to the circuit elements 22 and 23 mainly for the signal wiring and the wiring layer ML8 with large film thickness and low resistance mainly for the power supply wiring, it is possible to efficiently supply power to the circuit elements 22 and 23.

Moreover, the electrode pad 110 included in the semiconductor device according to this embodiment includes an external electrode connection region 111 to be connected to an external electrode terminal using a bump and wire bonding and a probing region 112 to be in contact with the probe of the inspection device. The probing region 112 is a region to be in contact with the probe of the inspection device, thus larger stress is imposed on the probing region 112 than the stress imposed on the external electrode connection region 111.

In the semiconductor device according to this embodiment, an interlayer insulating film 115 is formed in a region 113 of the top wiring layer ML8 among the plurality of wiring layers ML1 to ML8 (i.e., in a region where the probing region 112 of the electrode pad 110 and the first circuit region 15 overlap in a planar view of the electrode pad 110). By forming the interlayer insulating film 115 in the region 113 on the top wiring layer ML8, it is possible to suppress the characteristics of the circuit element 22 from deteriorating caused by the stress imposed on the probing region 112. That is, the interlayer insulating film 115 functions as a stress relief layer. As a consequence, the circuit other than the I/O circuit (i.e., the internal circuit region 3) can be disposed in the probing region 113 of the electrode pad 110 to efficiently use the region 113, thereby enabling the reduction in the chip size.

Figure 16:
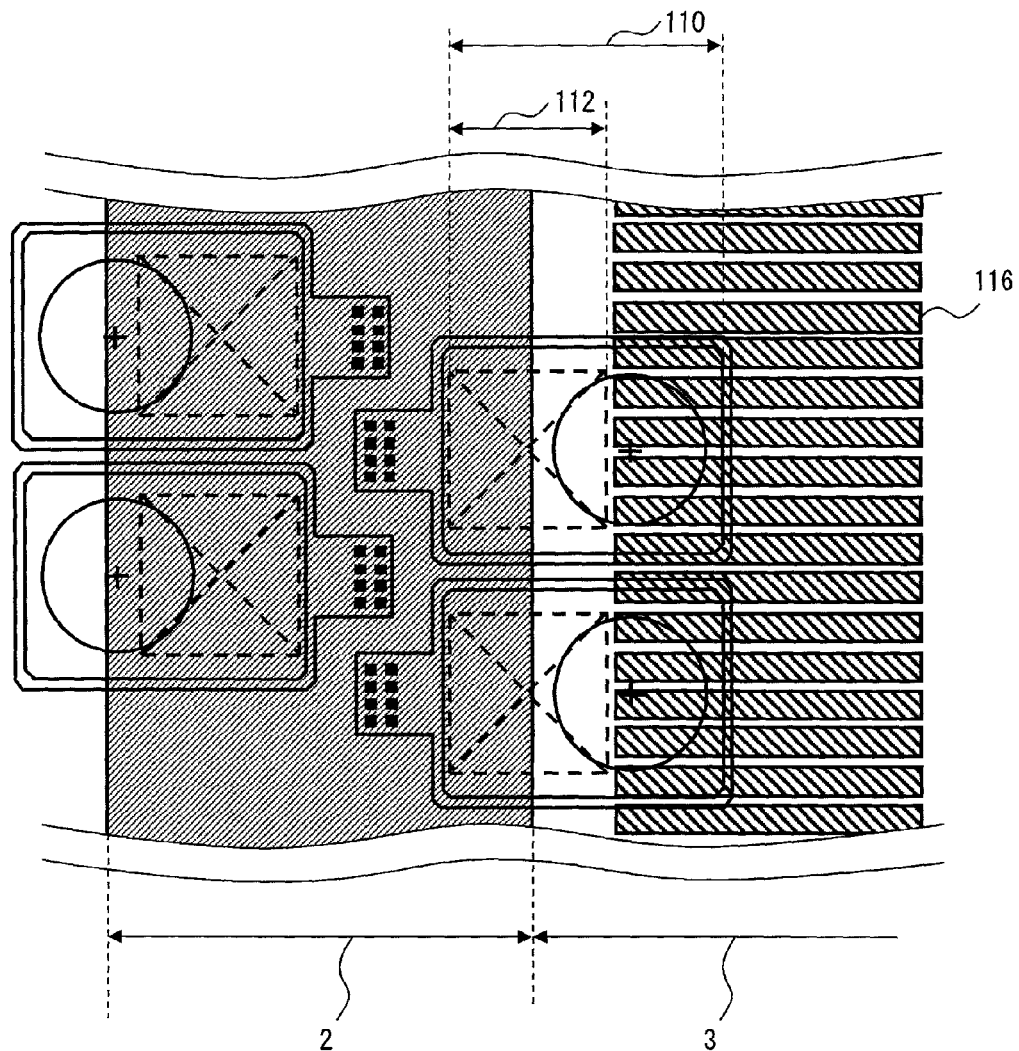
FIG. 16 is a top view of the semiconductor device according to the third embodiment.
Figure 17:
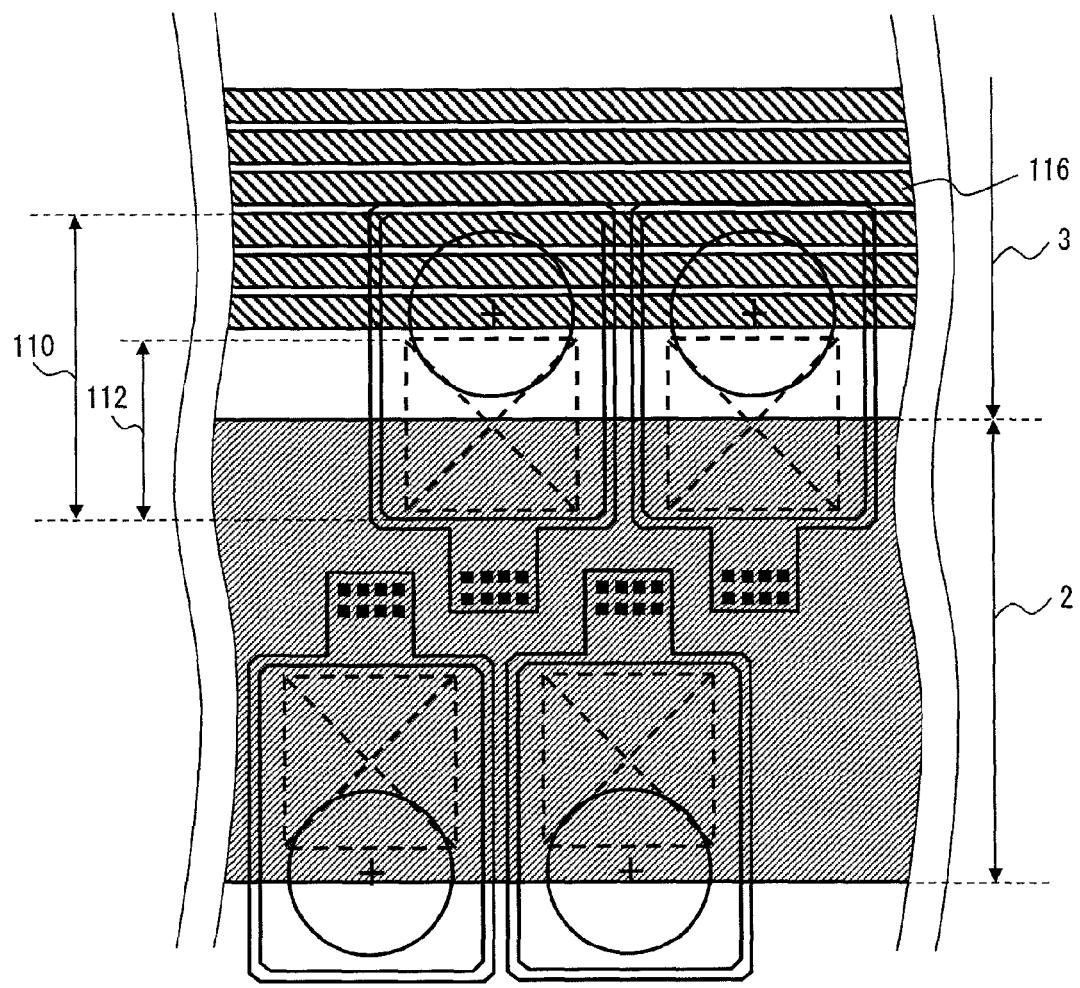
FIG. 17 is a top view of the semiconductor device according to the third embodiment.

FIGS. 16 and 17 are top views showing the semiconductor device according to this embodiment. FIGS. 16 and 17 illustrate the positional relationship between the region 110 where the electrode pads are formed, the probing region 112, and the conductor patterns 116 of the wiring layer ML8, and other components are not shown. FIG. 16 shows the periphery of the electrode pad provided on the left hand side of the semiconductor device shown in FIG. 1. Moreover, FIG. 17 shows the periphery of the electrode pads provided on the lower part of the semiconductor device shown in FIG. 1.

In the I/O circuit region 2 of the semiconductor device, the power supply main lines (not shown) are disposed surrounding in parallel with the sides around the semiconductor device. In the internal circuit region 3, the conductor patterns 116 of the wiring layer ML8 are formed as the power supply main lines in the horizontal direction of the drawing. In addition, the conductor patterns 116 of the wiring layer ML8 are formed until the end part of the probing region 112 near the electrode pads shown in FIG. 16. Moreover, the conductor patterns 116 of the wiring layer ML8 are formed until the end part of the probing region 112 in the periphery of the electrode pads shown in FIG. 17.

By forming the probing region 112 of the electrode pad 110 on the I/O circuit region 2 side and the external electrode connection region 111 on the internal circuit region 3 side, it is possible to reduce the part where the probe region 112 and the internal circuit region 3 overlap, and thereby enabling the conductor patterns 116 of the wiring layer ML8 to be disposed near the end part of the internal circuit region 3. Therefore, sufficient power can be supplied to the circuit element 22 disposed below the electrode pad 110 even when only the top wiring layer ML8 is used as the power supply wiring.

Note that this embodiment explained the case in which the electrode pads are formed across the I/O circuit region and the internal circuit region 3, however this embodiment can be applied in a similar manner to the case in which the electrode pads are formed in the internal circuit region (i.e., in the case of the electrode pad 6 in FIG. 1).

Fourth Embodiment

Next, a fourth embodiment is explained. A semiconductor device according to this embodiment includes a power switch circuit as the circuit element included in the semiconductor device explained in the third embodiment. Note that the same components as in the third exemplary embodiment are denoted by the same reference numerals therein, and the explanation will not be repeated here as appropriate.

Figure 18:
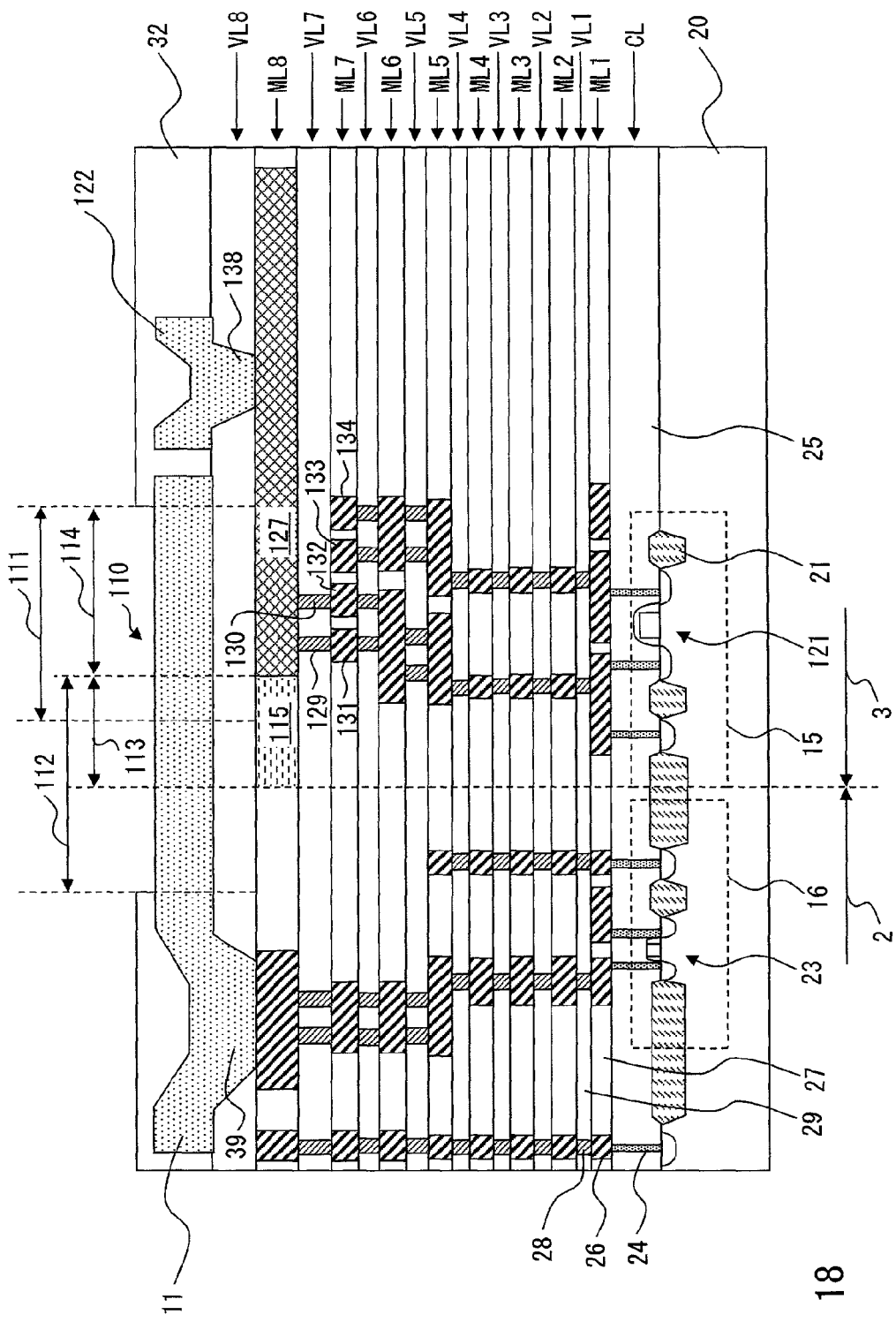
FIG. 18 is a cross-sectional diagram of a semiconductor device according to a fourth embodiment.

FIG. 18 is a cross-sectional diagram of the semiconductor device according to this embodiment. The cross-sectional diagram shown in FIG. 15 corresponds to the cross-sectional diagram shown in FIG. 18, and the electrode pad 110 is formed across the I/O circuit region 2 and the internal circuit region 3.

As shown in FIG. 18, the semiconductor device has the substrate 20, the contact layer CL, the wiring layers ML1 to ML8, the via layers VL1 to VL8, and the electrode pad 110. The wiring layers ML1 to ML8 and the via layers VL1 to VL8 compose a multilayer wiring layer.

A p-type silicon single crystal can be used for the substrate 20, for example. The grooved separation parts 21, for example, are formed in the surface of this substrate 20. The separation parts 21 can be formed by embedding an insulating film, such as silicon oxide, in the grooves formed in the surface of the substrate 20. A power switch circuit (for example, NMOS transistor) 121 and the circuit element 23 are formed in the regions surrounded by the separation parts 21. The power switch circuit 121 is formed in the first circuit region 15. The first circuit region 15 is a region included in the internal circuit region 3. Moreover, the circuit element 23 is formed in the second circuit region 16. The second circuit region 16 is a region included in the I/O circuit region 2.

The contact layer CL is formed on the surface of the substrate 20. The contact layer CL is a layer for connecting the power switch circuit 121 and the circuit element 23 formed on the surface of the substrate 20 and the conductor patterns 26 formed in the wiring layer ML1. That is, the conductor patterns 26 formed in the wiring layer ML1 are electrically connected to the power switch circuit 121 and the circuit element 23 through the plugs 24. The contact layer CL includes the plugs 24 and the interlayer insulating film 25. Note that the contact layer CL has the same configuration as the contact layer CL explained in FIG. 15, thus the explanation will not be repeated here.

The wiring layer ML1 includes the conductor patterns 26 and the interlayer insulating film 27. Note that the wiring layer ML also has the same configuration as the wiring layer ML1 explained in FIG. 15, thus the explanation will not be repeated here.

The via layer VL1 is a layer for connecting the conductor patterns formed in the wiring layer ML1 and the conductor patterns formed in the wiring layer ML2. That is, the conductor patterns formed in the wiring layer ML2 is connected to the conductor pattern formed in the wiring layer ML1 through the vias 28. The via layer VL1 includes the vias 28 and the interlayer insulating film 29. Note that the via layer VL also has the same configuration as the via layer VL explained in FIG. 15, thus the explanation will not be repeated here.

Also in the semiconductor device shown in FIG. 18, the plurality of wiring layers ML1 to ML8 and via layers VL1 to VL8 as above are alternately laminated. The Al wiring layer provided with the conductor pattern 11 including the electrode pad 110 and a power supply line (VSS) 122 is formed on the via layer VL8, and the Al wiring layer is covered with the insulating film 32 except for the part where an opening (electrode pad 110) is formed. In addition, the power supply line 122 and the conductor pattern 127 of the wiring layer ML8 are electrically connected to each other through a via 138 formed in the via layer VL8. Moreover, the conductor pattern 11 and the conductor pattern of the wiring layer ML8 are electrically connected to each other through the via 39 formed in the via layer VL8.

Such a configuration enables electrical connection between the electrode pad 110 and the circuit element 23. This further enables the power supply line (VSS) 122 and the power switch circuit 121 to be electrically connected.

Moreover, the electrode pad 110 included in the semiconductor device according to this embodiment includes the external electrode connection region 111 to be connected to an external electrode terminal using a bump and wire bonding and the probing region 112 to be in contact with the probe of the inspection device. The probing region 112 is a region to be in contact with the probe of the inspection device, thus larger stress is imposed on the probing region 112 than the stress imposed on the external electrode connection region 111.

In the semiconductor device according to this embodiment, the interlayer insulating film 115 is formed in the region 113 of the top wiring layer ML8 among the plurality of wiring layers ML1 to ML8 (i.e., in a region where the probing region 112 of the electrode pad 110 and the first circuit region 15 overlap in a planar view of the electrode pad 110). By forming the interlayer insulating film 115 in the region 113 on the top wiring layer MLS, it is possible to suppress the characteristics of the power switch circuit 121 from deteriorating caused by the stress imposed on the probing region 112. That is, the interlayer insulating film 115 functions as a stress relief layer. As a consequence, the circuit other than the I/O circuit (i.e., the internal circuit region 3) can be disposed in the probing region 113 of the electrode pad 110 to efficiently use the region 113, thereby enabling the reduction in the chip size.

Moreover, in the semiconductor device according to this embodiment, the power switch circuit 121 is used to switch the connection between the ground side power supply line (VSS) 122 and power supply nodes VSSM (133 and 134) of the wiring layer ML7. The power supply nodes VSSM (133 and 134) of the wiring layer ML7 are connected to the VSSM power supply main lines of the wiring layer ML8 (details are explained later). The VSSM power supply main line of the wiring layer ML8 is connected to each circuit element of the internal circuit region 3. Although the configuration is explained in this example that uses the ground side NMOS switch, the same advantages can be achieved by a switch for blocking the power side and a PMOS switch.

That is, the power supply line (VSS) 122 is connected to the power switch circuit 121 through the via 138, the conductor pattern 127 of the wiring layer ML8, the vias 129 and 130, the conductor patterns 131 and 132 of the wiring layer ML7, the wiring layers ML1 to ML6, the via layers VL1 to VL6, and the contact layer CL. Moreover, the power switch circuit 121 is connected to the conductor patterns 133 and 134 of the wiring layer ML7 through the contact layer CL, the wiring layers ML1 to ML6, and the via layers VL1 to VL6.

Figure 19:
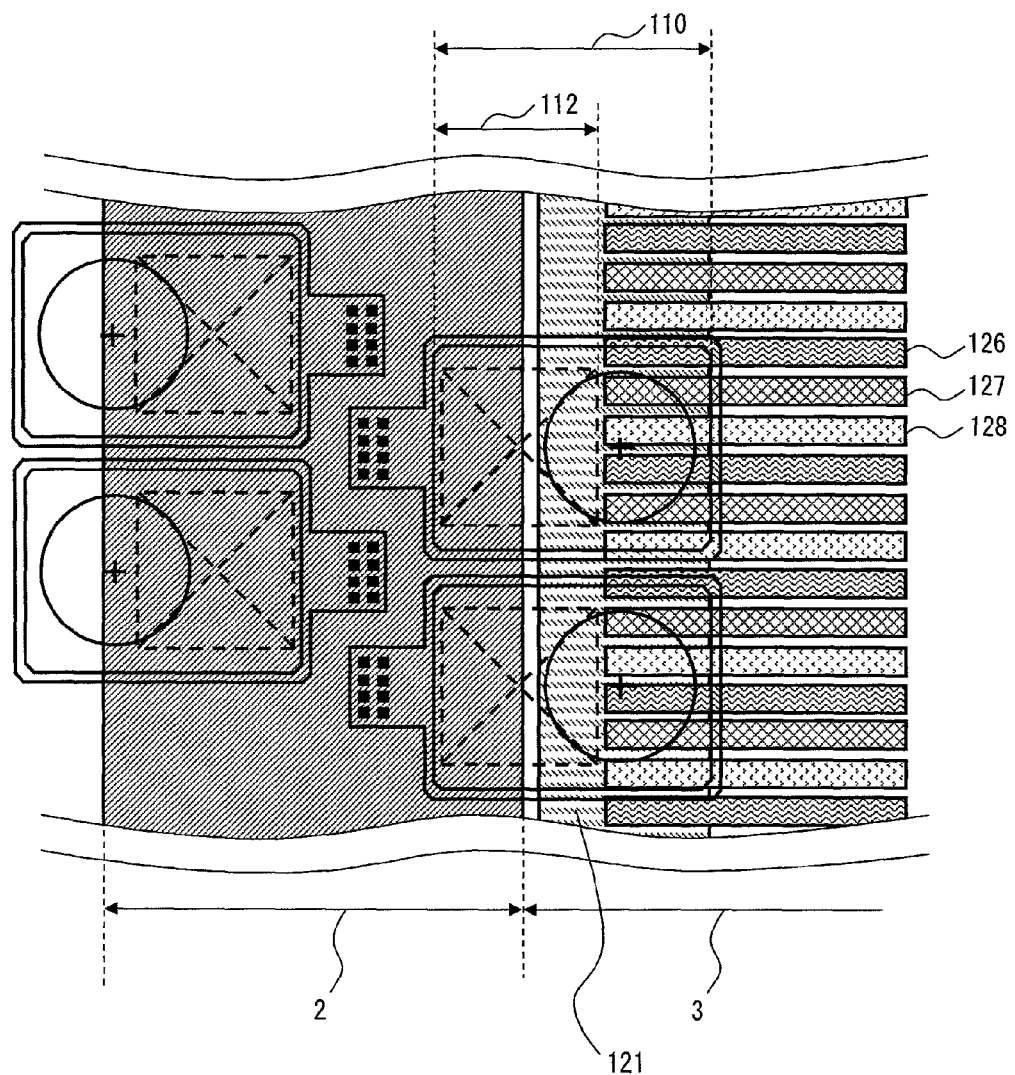
FIG. 19 is a top view of the semiconductor device according to the fourth embodiment.
Figure 20:
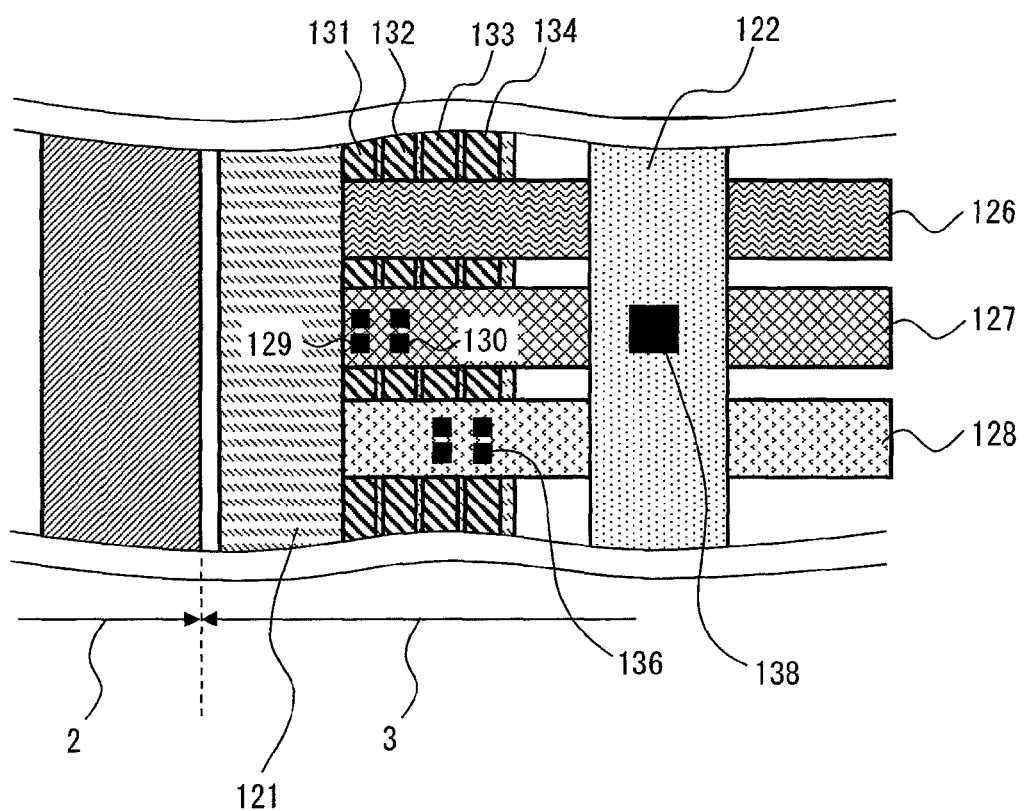
FIG. 20 is a top view of the semiconductor device according to the fourth embodiment.

FIGS. 19 and 20 are top views of the semiconductor device according to this embodiment. FIG. 19 illustrates the positional relationship between the region 110 where the electrode pads are formed, the probing region 112, the conductor patterns 126, 127, and 128 of the wiring layer ML8, and other components are not shown. Moreover, FIG. 20 is an enlarged view showing the periphery of the conductor patterns 126, 127, and 128 shown in FIG. 19. FIG. 20 illustrates the positional relationship between the region 110 where the electrode pads are formed, the probing region 112, the conductor patterns 126, 127, and 128 of the wiring layer ML8, and the conductor patterns 131, 132, 133, and 134 of the wiring layer ML7, and other components are not shown. The conductor pattern 126 of the wiring layer ML8 is a VDD power supply main line, the conductor pattern 127 is a VSS power supply main line, and the conductor pattern 128 is a VSSM power supply main line.

As shown in FIG. 19, the conductor pattern 126 (VDD power supply main line) of the wiring layer ML8, the conductor pattern 127 (VSS power supply main line), and the conductor pattern 128 (VSSM power supply main line) are formed in the internal circuit region 3 in the horizontal direction of the drawing. In addition, the conductor patterns 126, 127, and 128 of the wiring layer ML8 are formed not to overlap the probing region 112. Moreover, the power switch circuit 121 is formed below the electrode pad 110.

As shown in FIG. 20, the power supply line (VSS) 122 is connected to the conductor pattern 127 (VSS power supply main line) of the wiring layer ML8 through the via 138. The conductor pattern 127 (VSS power supply main line) of the wiring layer ML8 is connected to the conductor patterns 131 and 132 of the wiring layer ML7 through the vias 129 and 130. Moreover, as shown in FIG. 18, the conductor patterns 131 and 132 of the wiring layer ML7 are connected to the power switch circuit 121 through the wiring layers ML1 to ML6, the via layers VL1 to VL6, and the contact layer CL. The power switch circuit 121 is connected to the conductor patterns 133 and 134 of the wiring layer ML7 through the contact layer CL, the wiring layers ML1 to ML6, and the via layers VL1 to VL6. Moreover, as shown in FIG. 20, the conductor patterns 133 and 134 of the wiring layer ML7 are connected to the conductor pattern 128 (VSSM power supply main line) of the wiring layer ML8 through vias 136.

A region 114 except for the probing region 112 of the electrode pad 110 is a region where low stress imposed on the electrode pad 110. However, when a semiconductor device is mounted, it is preferable to dispose the circuit elements sensitive to the stress below the external electrode connection region 111 due to certain stress imposed on the external electrode connection region 111 of the electrode pad 110.

In the semiconductor device according to this embodiment, the power switch circuit that is relatively insusceptible to the stress is disposed below the external electrode connection region 111. Specifically, in the case of the power switch circuit, only the influence of the stress on the NMOS transistor alone needs to be understood, thereby reducing the influence on the circuit element by the stress imposed on the electrode pad 110.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a substrate including a first circuit region, a first circuit element being formed in the first circuit region;
   a multilayer wiring layer that is formed on the substrate and composed of a plurality of wiring layers and a plurality of via layers that are laminated; and
   an electrode pad that is formed on the multilayer wiring layer,
   wherein an interlayer insulating film is formed in a region of a first wiring layer that is a top layer of the plurality of wiring layers, in a region in which the electrode pad and the first circuit region overlap each other in a planar view of the electrode pad,
   wherein the substrate further includes a second circuit region where a second circuit element is formed that is less susceptible to stress as compared to the first circuit element, and
   wherein the electrode pad overlaps the first circuit region and the second circuit region in the planar view of the electrode pad.

2. The semiconductor device according to claim 1, wherein the electrode pad includes a first pad region and a second pad region constructed so that a larger stress is imposed on the second pad region than a stress imposed on the first pad region, and
   an interlayer insulating film is formed in a region of the first wiring layer, in the region in which the second pad region and the first circuit region overlap each other in the planar view of the electrode pad.

3. The semiconductor device according to claim 2,
   wherein a first conductor pattern is formed in at least a part of a region of the first wiring layer, in a region other than the region in which the second pad region and the first circuit region overlap in the planar view of the electrode pad.

4. The semiconductor device according to claim 3, wherein a second conductor pattern is formed across the first and second pad regions in a second wiring layer, which is a wiring layer immediately below the first wiring layer, and
   the first and second conductor patterns are connected through a via.

5. The semiconductor device according to claim 2,
   wherein the first pad region is formed on a side of the first circuit region and the second pad region is formed on a side of the second circuit region in the planar view of the electrode pad.

6. The semiconductor device according to claim 2,
   wherein a projection is formed to a part corresponding to the second pad region in a periphery of the electrode pad.

7. The semiconductor device according to claim 2,
   wherein a length of the first pad region in a direction vertical to a longitudinal direction of the electrode pad is different from a length of the second pad region in the direction vertical to the longitudinal direction of the electrode pad.

8. The semiconductor device according to claim 1,
   wherein the first circuit region is formed in an internal circuit region, and the second circuit region is formed in an I/O circuit region.

9. The semiconductor device according to claim 8,
   wherein the I/O circuit region is disposed along a circumference of the semiconductor device to surround the internal circuit region.

10. The semiconductor device according to claim 8, wherein
    the first circuit element formed in the internal circuit region includes at least one of a memory circuit and a logic circuit, and
    the second circuit element formed in the I/O circuit region includes at least one of an input buffer circuit, an output buffer circuit, and a level shifter.

11. The semiconductor device according to claim 2,
    wherein an analog circuit is formed in a region where the first pad region of the substrate is formed in the planar view of the electrode pad.

12. The semiconductor device according to claim 11,
    wherein the analog circuit includes at least one of a PLL circuit and a regulator circuit.

13. The semiconductor device according to claim 2,
    wherein the first circuit element formed in the first circuit region is a power switch circuit.

14. A manufacturing method for a semiconductor device comprising:
    forming a first circuit element in a first circuit region of a substrate;
    forming a multilayer wiring layer on the substrate, the multilayer wiring layer being composed of a plurality of wiring layers and a plurality of via layers that are alternately laminated; and
    forming an electrode pad on the multilayer wiring layer;
    forming a second circuit element in a second circuit region of the substrate, the second circuit element being less susceptible to stress than the first circuit element; and forming the electrode pad to overlap the first circuit region and the second circuit region in the planar view of the electrode pad, wherein at the time of forming the multilayer wiring layer, an interlayer insulating film is formed in a region of a first wiring layer that is a top layer of the plurality of wiring layers, in a region the electrode pad and the first circuit region overlap each other in a planar view of the electrode pad.

15. The manufacturing method for the semiconductor device according to claim 14, further comprising:

forming a first pad region and a second pad region on the electrode pad, said first and second pad regions being constructed such that a larger stress is imposed on the second pad region than a stress imposed on the first pad region; and at the time of forming the multilayer wiring layer, forming an interlayer insulating film in a region of the first wiring layer where the electrode pad and the first circuit region overlap each other in the planar view of the electrode pad.

* * * * *